(12) United States Patent
Fukutome

(10) Patent No.: US 7,898,036 B2
(45) Date of Patent: Mar. 1, 2011

(54) SEMICONDUCTOR DEVICE AND PROCESS FOR MANUFACTURING THE SAME

(75) Inventor: Hidenobu Fukutome, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 343 days.

(21) Appl. No.: 12/177,602

(22) Filed: Jul. 22, 2008

(65) Prior Publication Data

US 2008/0277733 A1 Nov. 13, 2008

Related U.S. Application Data

(63) Continuation of application No. PCT/JP2006/303388, filed on Feb. 24, 2006.

(51) Int. Cl.
*H01L 21/70* (2006.01)

(52) U.S. Cl. .............................. 257/368; 257/E27.006

(58) Field of Classification Search ................. 257/368, 257/E29.255, E21.409, E27.06, E27.006; 438/303, 257, 289
See application file for complete search history.

(56) References Cited

U.S. PATENT DOCUMENTS

| 5,898,207 | A | 4/1999 | Takase et al. |
| 6,083,816 | A | 7/2000 | Kanamori |
| 7,453,108 | B2 * | 11/2008 | Jin ............................. 257/288 |

FOREIGN PATENT DOCUMENTS

| JP | 3-46261 A | 2/1991 |
| JP | 5-211163 A | 8/1993 |
| JP | 7-115188 A | 5/1995 |
| JP | 2718767 B2 | 11/1997 |
| JP | 10-65167 A | 3/1998 |
| JP | 10-209445 A | 8/1998 |
| JP | 11-163131 A | 6/1999 |
| JP | 2003-234455 A | 8/2003 |

OTHER PUBLICATIONS

K. Ota et al; "Stress Controlled Shallow Trench Isolation Technology to Suppress the Novel Anti-Isotropic Impurity Diffusion for 45nm-node High-Performance CMOSFETs," 2005 Symposium on VLSI Technology Digest of Technical Papers; pp. 138-139.
S. Pidin et al; "A Novel Strain Enhanced CMOS Architecture Using Selectively Deposited High Tensile and High Compressive Silicon Nitride Films," IEDM Tech. Dig; p. 213; 2004.
International Search Report of PCT/JP2006/303388, date of mailing Jun. 6, 2006.

* cited by examiner

*Primary Examiner*—Thomas L Dickey
*Assistant Examiner*—Nikolay Yushin
(74) *Attorney, Agent, or Firm*—Fujitsu Patent Center

(57) ABSTRACT

A semiconductor device includes a semiconductor substrate; a gate electrode formed on the semiconductor substrate; source and drain extension regions formed in the semiconductor substrate on a first and a second side corresponding to a first sidewall surface and a second sidewall surface, respectively, of the gate electrode; a first piezoelectric material pattern formed on the semiconductor substrate continuously covering the first sidewall surface of the gate electrode from the first side of the gate electrode; a second piezoelectric material pattern formed on the semiconductor substrate continuously covering the second sidewall surface of the gate electrode from the second side of the gate electrode; and source and drain regions formed in the semiconductor substrate outside the source extension region and the drain extension, respectively.

8 Claims, 23 Drawing Sheets

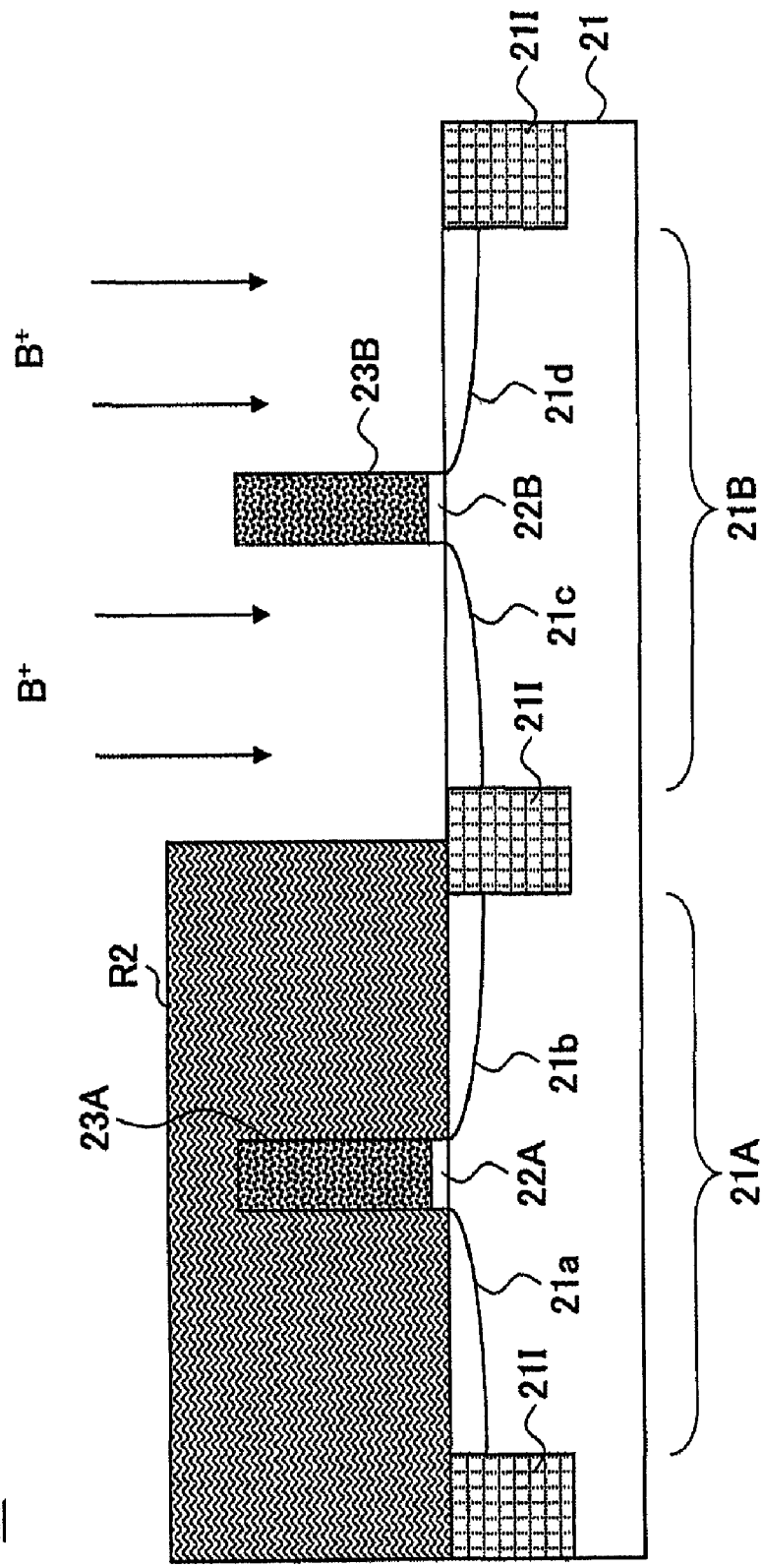

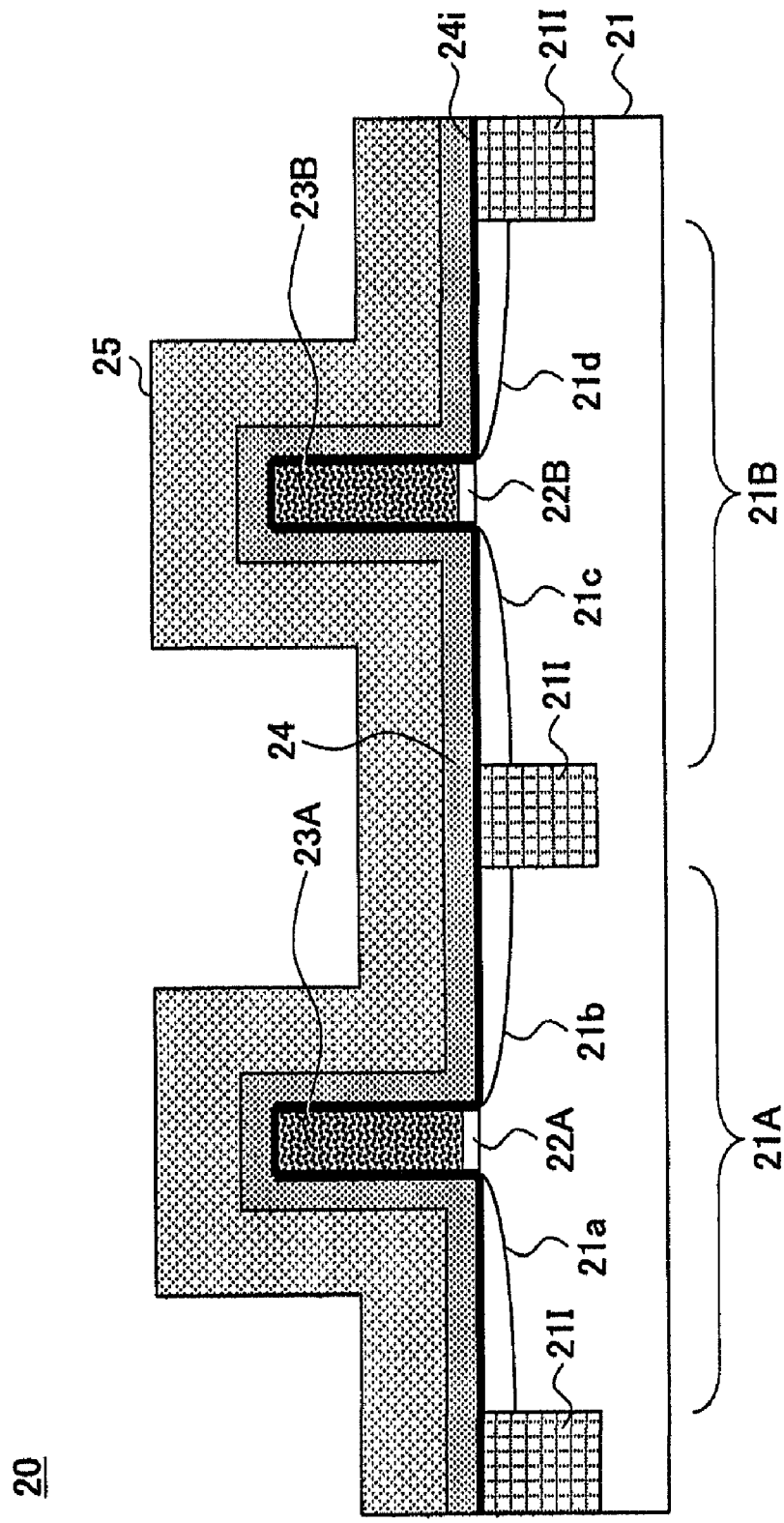

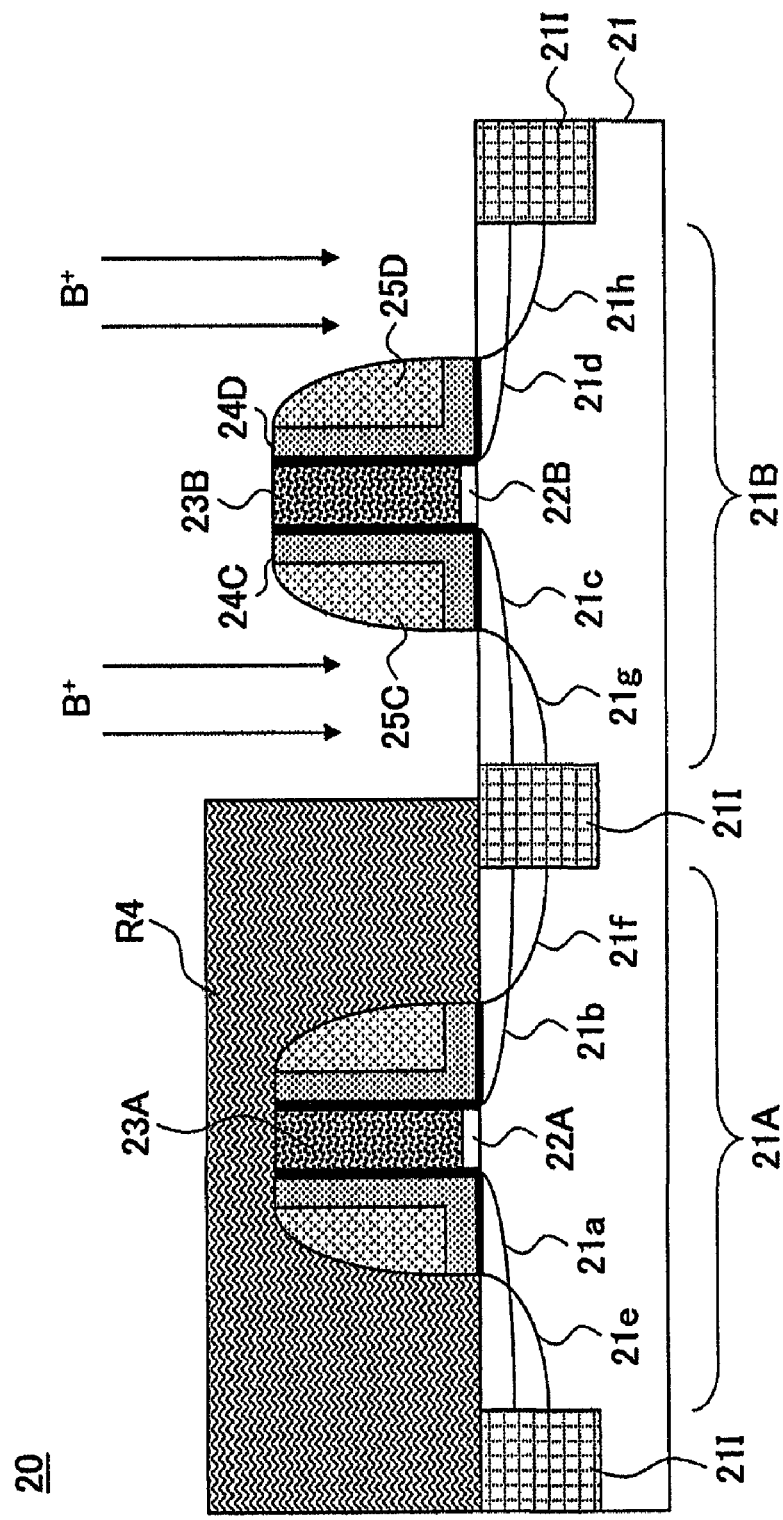

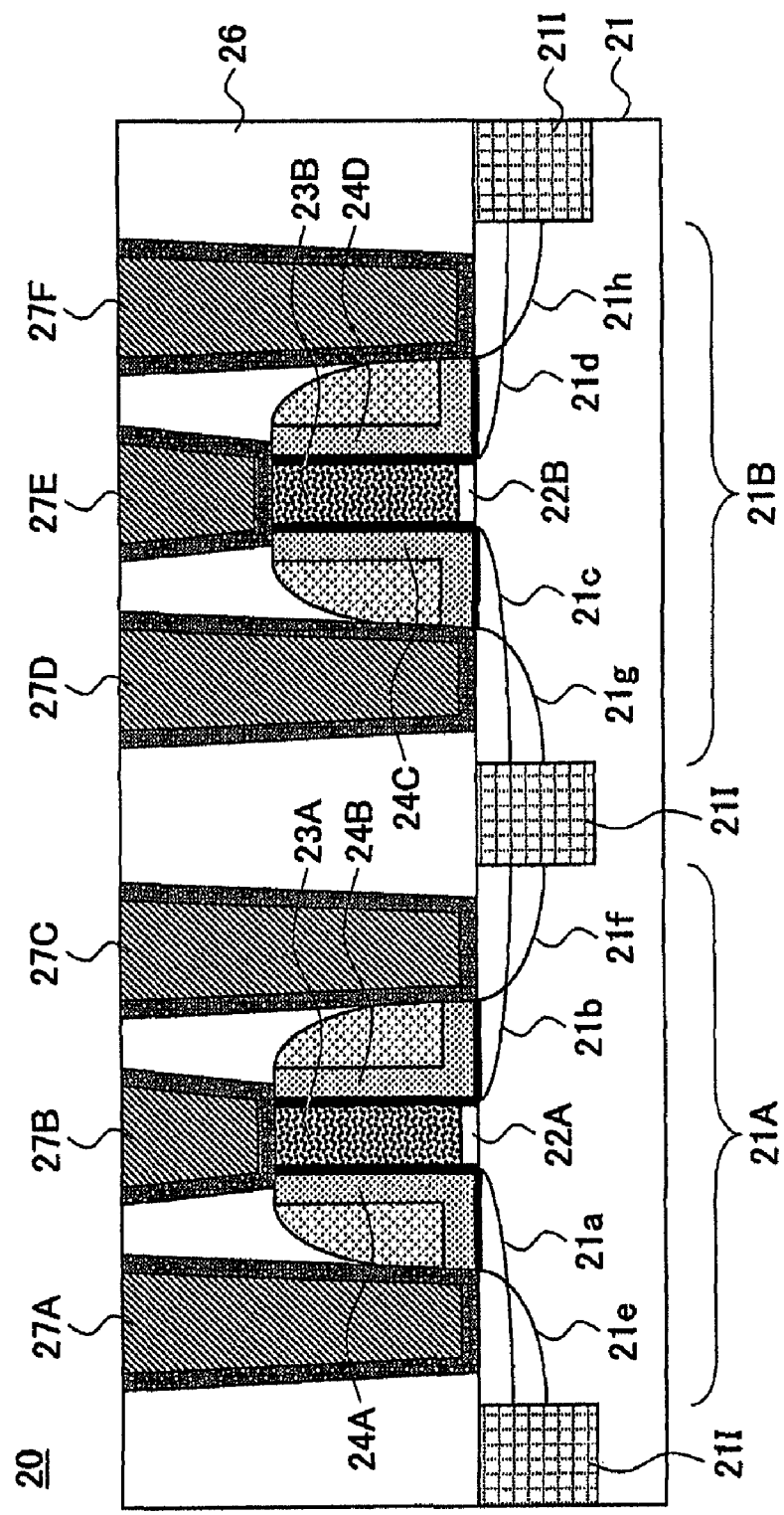

pMOS $V_S$ = GND
$V_D$ = −1V
$V_G$ = 0V
OFF pMOS $V_S$ = GND
$V_D$ = −1V
$V_G$ = −1V
ON nMOS $V_S$ = GND
$V_D$ = +1V
$V_G$ = 0V
OFF nMOS $V_S$ = GND
$V_D$ = +1V
$V_G$ = +1V
ON

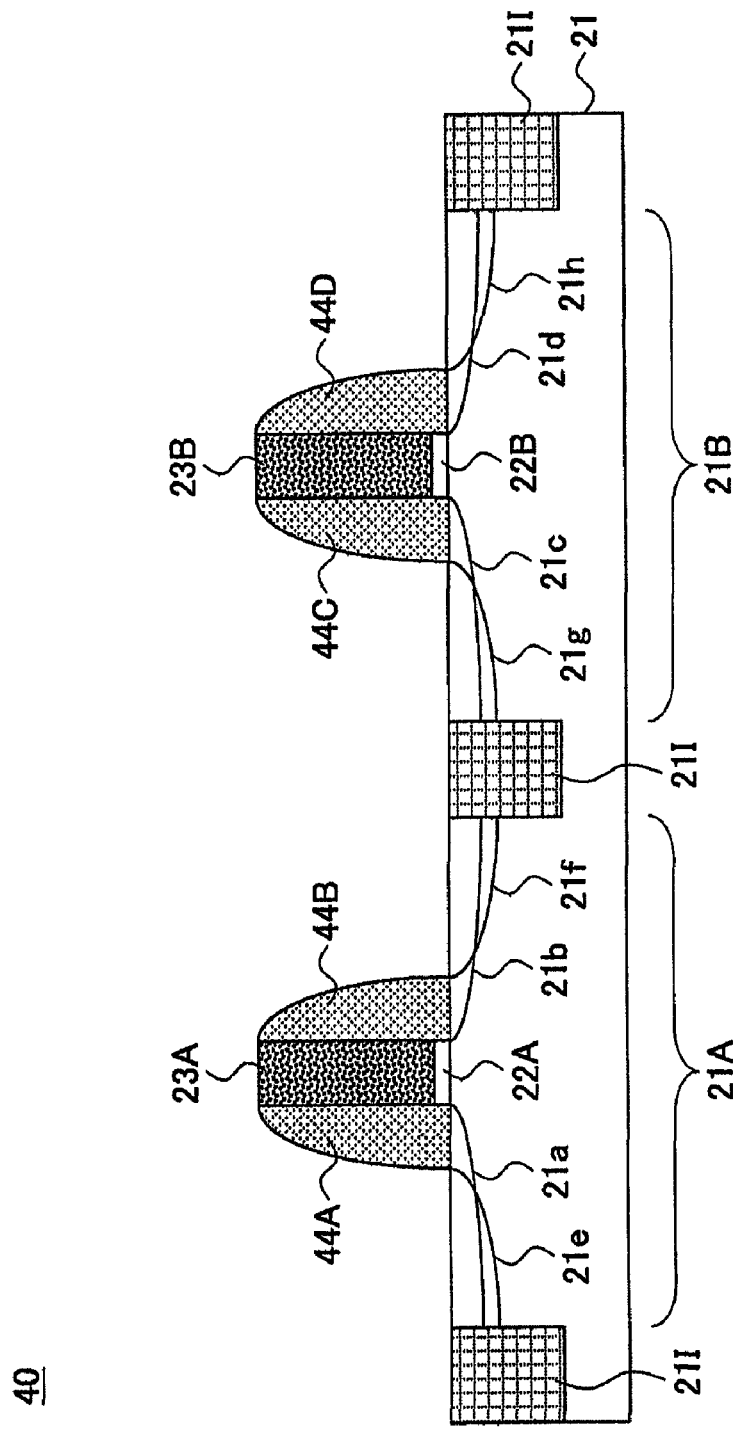

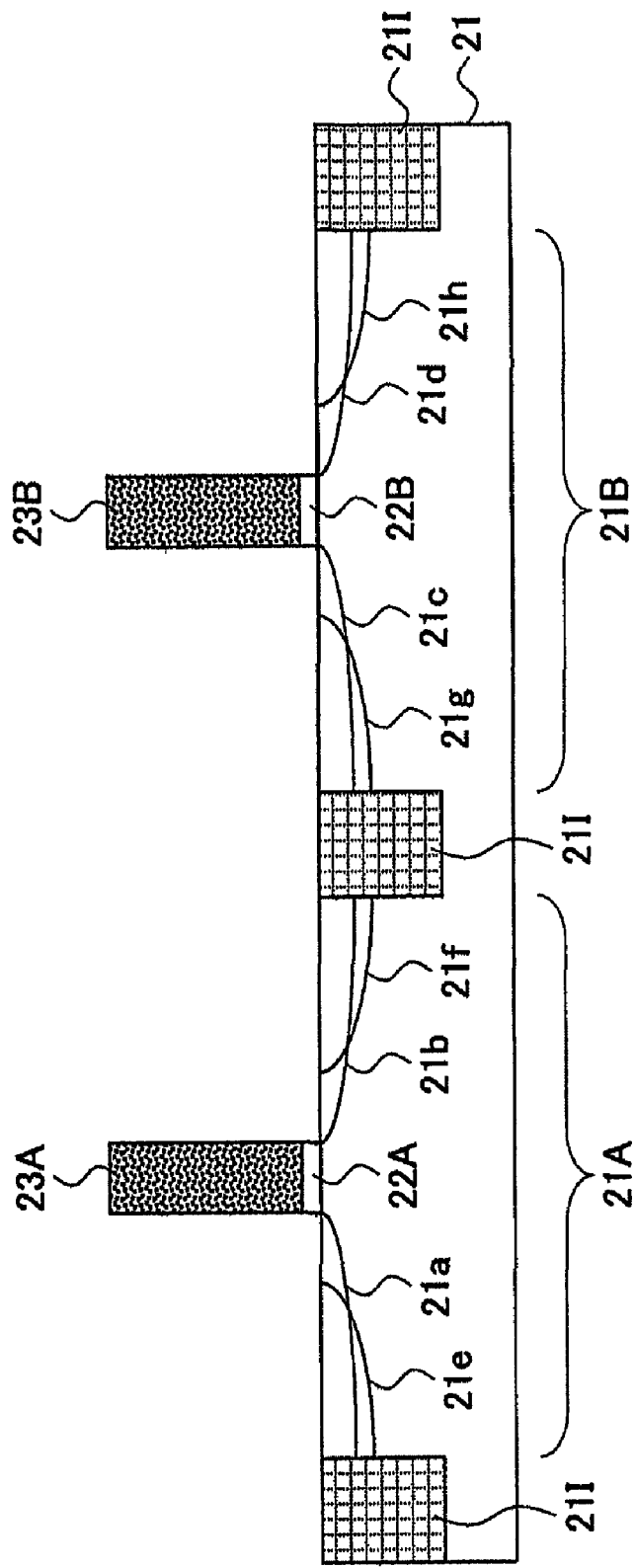

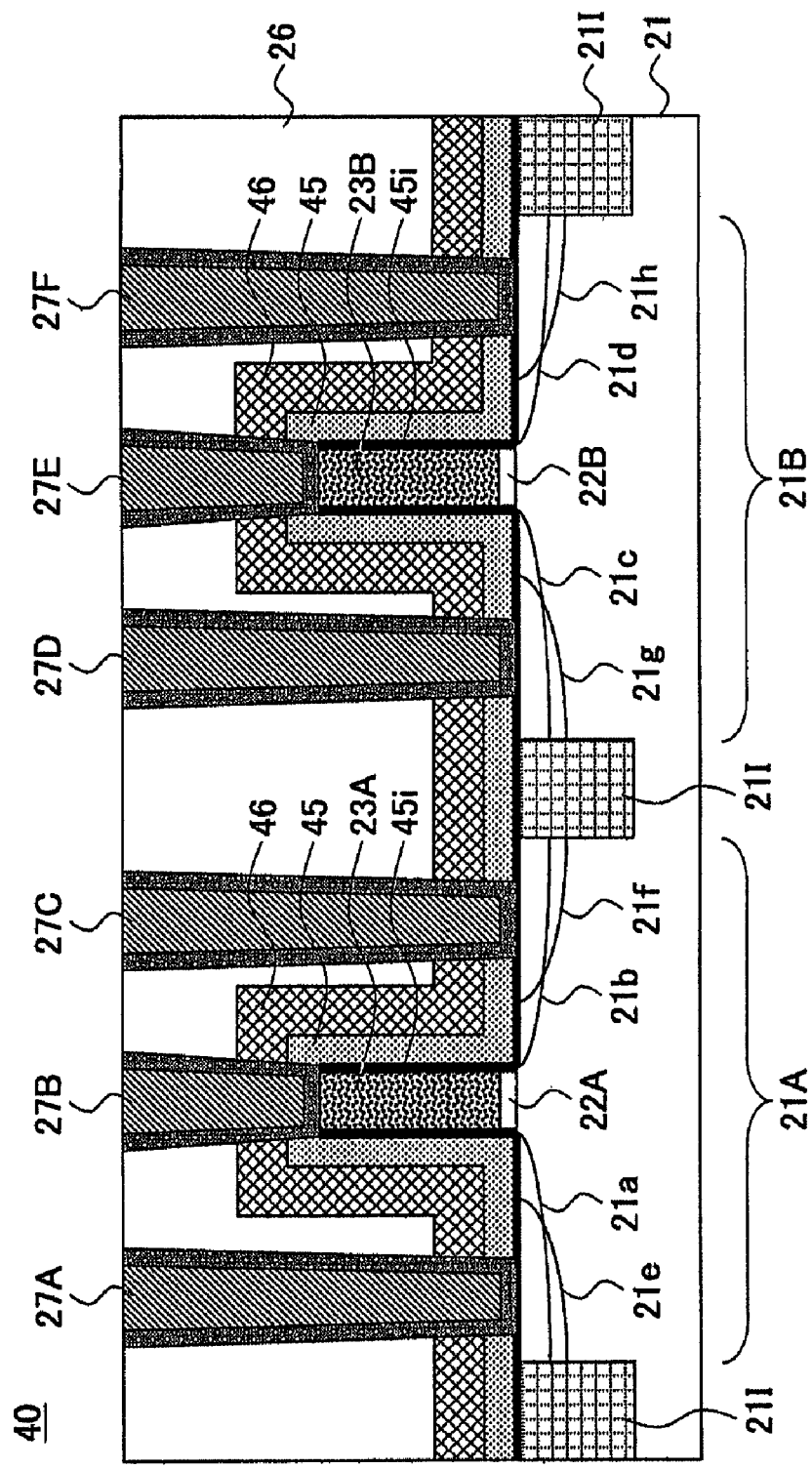

US 7,898,036 B2

SEMICONDUCTOR DEVICE AND PROCESS FOR MANUFACTURING THE SAME

CROSS-REFERENCE TO RELATED APPLICATION

This application is a U.S. continuation application filed under 35 USC 111(a) claiming benefit under 35 USC 120 and 365(c) of PCT application JP2006/303388, filed Feb. 24, 2006. The foregoing application is hereby incorporated herein by reference.

BACKGROUND OF THE INVENTION

1. Field of the Invention

The present invention relates to semiconductor devices, and more particularly to a semiconductor device of which the operating speed is increased by stress application, and to a process of manufacturing the same.

2. Description of the Related Art

With the development of microfabrication technology, nowadays it is possible to fabricate an ultrafine and ultra-high speed semiconductor device having a gate length of less than 100 nm.

In such an ultrafine and ultra-high speed transistor, the effect of simple reduction in process feature sizes is significantly smaller than before. Meanwhile, the mobility of electrons or holes that travel in the channel region is greatly influenced by stress applied to the channel region. Many attempts have been made to improve the operating speed of semiconductor devices by optimizing the stress applied to the channel region, which has become much smaller compared with earlier semiconductor devices. Relevant technologies are disclosed in Japanese Laid-Open Patent Application No. 2003-234455 and Japanese Patent No. 2718767, for example.

FIGS. 1A and 1B show ideal stress distributions for achieving improved operating speed in an n-channel MOS transistor and a p-channel MOS transistor, respectively, according to Ota, K. et al., 2005 Symposium on VLSI Technology Digest of Technical Papers, pp. 138-139.

With reference to FIG. 1A, in the n-channel MOS transistor, an n-type polysilicon gate electrode 3N is formed across a device region 1N. Thus, the device region 1N is divided by the polysilicon gate electrode 3N into an n-type source region S and an n-type drain region D.

Similarly, in the p-type MOS transistor shown in FIG. 1B, a p-type polysilicon gate electrode 3P is formed across a device region 1P, so that the device region 1P is divided into a p-type source region S and a p-type drain region D.

In the n-channel MOS transistor shown in FIG. 1A, when a tensile stress is applied in the gate width direction and the gate length direction (in-plane tensile stress), the mobility of electrons in the channel region immediately below the gate electrode 3N increases, whereby increased transistor operating speed is achieved. On the other hand, in the p-channel MOS transistor shown in FIG. 1B, when a tensile stress is applied in the gate width direction and a compressive stress is applied in the gate length direction (uniaxial compressive stress), the mobility of holes in the channel region immediately below the gate electrode 3P increases, whereby improved transistor operating speed can be obtained.

FIG. 2A shows a proposed structure for inducing the tensile stress immediately below the channel region of an n-channel MOS transistor in the gate length direction, as in FIG. 1A.

With reference to FIG. 2A, in a device region 1N defined on a silicon substrate 1, an $n^+$ polysilicon gate electrode 3N is formed via a gate insulating film 2N. In the silicon substrate 1, an n-type source extension region 1aN and an n-type drain extension region 1bN are formed on either side of the polysilicon gate electrode 3N within the device region 1N.

On either sidewall surface of the gate electrode 3N, sidewall insulating films 4nN consisting of SiN films are formed via sidewall oxide films 4oN. An $n^+$ source region 1cN and an $n^+$ drain region 1dN are formed in the silicon substrate 1 outside the sidewall insulating films 4nN within the device region 1N.

Over the $n^+$ source region 1cN, the drain region 1dN, and the $n^+$ gate electrode 3N, there are formed silicide films 5SN, 5DN, and 5GN, respectively. Over the silicon substrate 1, an SiN film 6N with a stored tensile stress is formed in such a manner as to continuously cover the silicide films 5SN, 5DN, and 5GN and the sidewall insulating films 4nN.

Due to the tensile stress in the SiN film 6N, the gate electrode 5GN is biased toward the silicon substrate 1 vertically with respect to the substrate surface. As a result, in the channel region immediately below the gate electrode 3N, there is induced a strain similar to the strain that results when the tensile stress is applied in the gate length direction in FIG. 1A.

FIG. 2B shows a proposed structure for inducing a compressive stress immediately below the channel region that acts in the gate length direction in a p-channel MOS transistor, as in FIG. 1B, according to Pidin, S., et al., IEDM Tech. Dig., p. 213, 2004.

With reference to FIG. 2B, in a device region 1P defined on a silicon substrate 1, a $p^+$ polysilicon gate electrode 3P is formed via a gate insulating film 2P. In the silicon substrate 1, a p-type source extension region 1aP and an p-type drain extension region 1bP are formed on either side of the polysilicon gate electrode 3P within the device region 1P.

On either sidewall surface of the gate electrode 3P, sidewall insulating films 4nP consisting of SiN films are formed via sidewall oxide films 4oP. In the silicon substrate 1, a $p^+$ source region 1cP and a $p^+$ drain region 1dP are formed outside the sidewall insulating films 4nP within the device region 1P.

Over the $p^+$ source region 1cP, the drain region 1dP, and the $p^+$ gate electrode 3P, silicide films 5SP, 5DP, and 5GP are formed, respectively. Further, over the silicon substrate 1, an SiN film 6P with a stored compressive stress is formed in such a manner as to continuously cover the silicide films 5SP, 5DP, and 5GP and the sidewall insulating films 4nP.

Due to the compressive stress in the SiN film 6P, the gate electrode 3P is biased away from the silicon substrate 1 vertically with respect to the substrate surface. As a result, in the channel region immediately below the gate electrode 3P, there is induced a strain similar to the strain that results when the compressive stress is applied in the gate length direction in FIG. 1B.

However, when such an n-channel MOS transistor and a p-channel MOS transistor are to be formed on the same substrate in order to form a CMOS device, for example, using the structures shown in FIGS. 2A and 2B, it becomes necessary to form the tensile stress film 6N and the compressive stress film 6P separately, thereby requiring complex production steps.

Furthermore, in a strained semiconductor device manufactured according to a conventional process, the pattern and size of stress that can be applied to the channel region is determined by the semiconductor device manufacturing process, and the stress distribution cannot be changed freely after the manufacture of the semiconductor device.

SUMMARY OF THE INVENTION

In one aspect, the invention provides a semiconductor device comprising a semiconductor substrate; a gate electrode formed on the semiconductor substrate; source and drain extension regions formed in the semiconductor substrate on a first and a second side corresponding to a first sidewall surface and a second sidewall surface of the gate electrode; a first piezoelectric material pattern formed on the semiconductor substrate that continuously covers the first sidewall surface of the gate electrode from the first side of the gate electrode; a second piezoelectric material pattern formed on the semiconductor substrate that continuously covers the second sidewall surface of the gate electrode from the second side of the gate electrode; and source and drain regions formed in the semiconductor substrate outside the source extension region and the drain extension, respectively; and a contact forming a contact for applying a voltage to the piezoelectric material patterns.

In another aspect, the invention provides a process of manufacturing a semiconductor device comprising the steps of forming a gate electrode pattern on a semiconductor substrate; forming source and drain extension regions in the semiconductor substrate on a first and a second side, respectively, of the gate electrode pattern by introducing a first impurity element into the semiconductor substrate using the gate electrode pattern as a mask; forming a piezoelectric material film on the semiconductor substrate in such a manner as to cover the gate electrode and in a shape matching a shape of the gate electrode pattern; depositing an insulating film on the semiconductor substrate such that the piezoelectric material film is covered by the insulating film; forming a first sidewall insulating film and a second sidewall insulating film on the piezoelectric material film on the first side and the second side, respectively, of the gate electrode by etching back the insulating film; forming a source region and a drain region in the semiconductor substrate outside the first sidewall insulating film and the second sidewall insulating film, respectively, by introducing a second impurity element into the semiconductor substrate using the gate electrode pattern and the first and the second sidewall insulating films as masks; and forming a contact for applying a voltage to the piezoelectric material film.

In another aspect, the invention provides a process of manufacturing a semiconductor device comprising the steps of forming a gate electrode pattern on a semiconductor substrate; forming a source and a drain extension region in the semiconductor substrate on a first and a second side, respectively, of the gate electrode pattern by introducing a first impurity element into the semiconductor substrate using the gate electrode pattern as a mask; depositing an insulating film on the semiconductor substrate that covers the gate electrode pattern; depositing a first and a second sidewall insulating film on the first and the second side, respectively, of the gate electrode pattern by etching back the insulating film; forming a source and a drain region in the semiconductor substrate outside the first and the second sidewall insulating film, respectively, by introducing a second impurity element using the gate electrode pattern and the first and the second sidewall insulating films as masks; removing the first and the second sidewall insulating films; depositing a piezoelectric material film on the semiconductor substrate that covers the gate electrode pattern; and forming a contact for applying a voltage to the piezoelectric material film.

In accordance with the above invention, because a piezoelectric material film is formed covering the device region surface and the surface of the gate electrode pattern, a desired stress can be applied to the channel region depending on the drive state of the semiconductor device, so that the operating speed of the semiconductor device can be increased. Particularly, an asymmetric stress distribution can be induced between the source end and the drain end of the channel region, whereby the mobility can be increased in the on-state alone of a p-channel or n-channel MOS transistor, while the increase in mobility in the off-state can be prevented or reduced. Furthermore, there is no need to change the stress-applying structure between the p-channel MOS transistor and the n-channel MOS transistor, so that the semiconductor device manufacturing process can be simplified.

BRIEF DESCRIPTION OF THE DRAWINGS

These and other objects, features and advantages of the invention will be apparent to those skilled in the art from the following detailed description of the invention, when read in conjunction with the accompanying drawings in which:

FIG. 3B shows another step of the CMOS device manufacturing process;

FIG. 3D shows another step of the CMOS device manufacturing process;

FIG. 3G shows another step of CMOS device manufacturing process;

FIG. 3H shows another step of the CMOS device manufacturing process;

FIG. 9C shows another step of the CMOS device manufacturing process;

FIG. 9D shows another step of the CMOS device manufacturing process;

FIG. 9G shows another step of the CMOS device manufacturing process.

DETAILED DESCRIPTION OF THE PREFERRED EMBODIMENTS

First Embodiment

FIGS. 3A through 3H show a process of manufacturing a CMOS device 20 according to a first embodiment of the present invention.

Figure 1A:
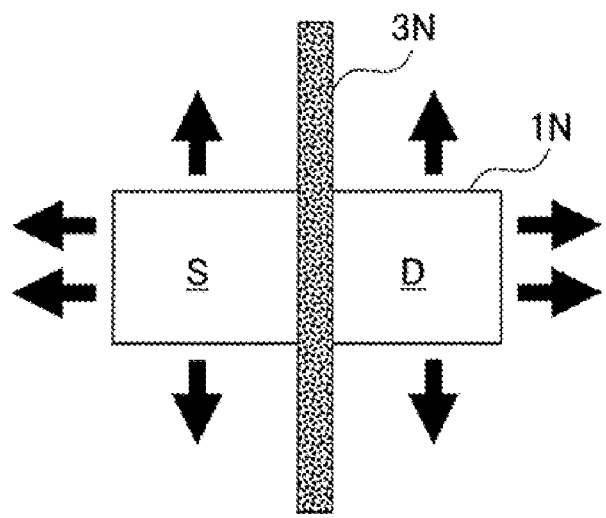
FIG. 1A illustrates the principle of a strained n-channel MOS transistor.
Figure 1B:
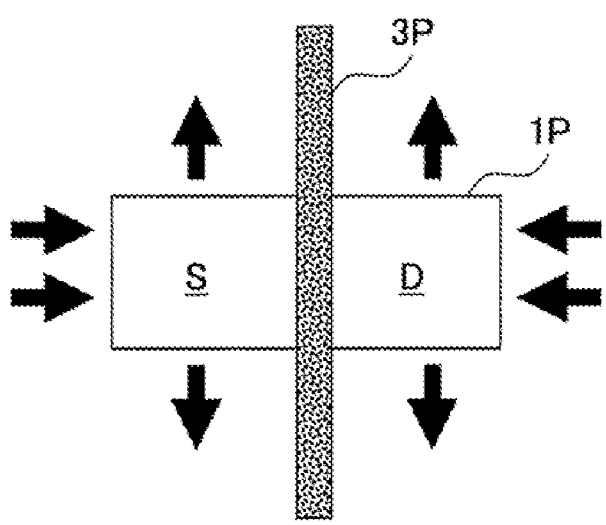
FIG. 1B illustrates the principle of a strained p-channel MOS transistor.
Figure 2A:
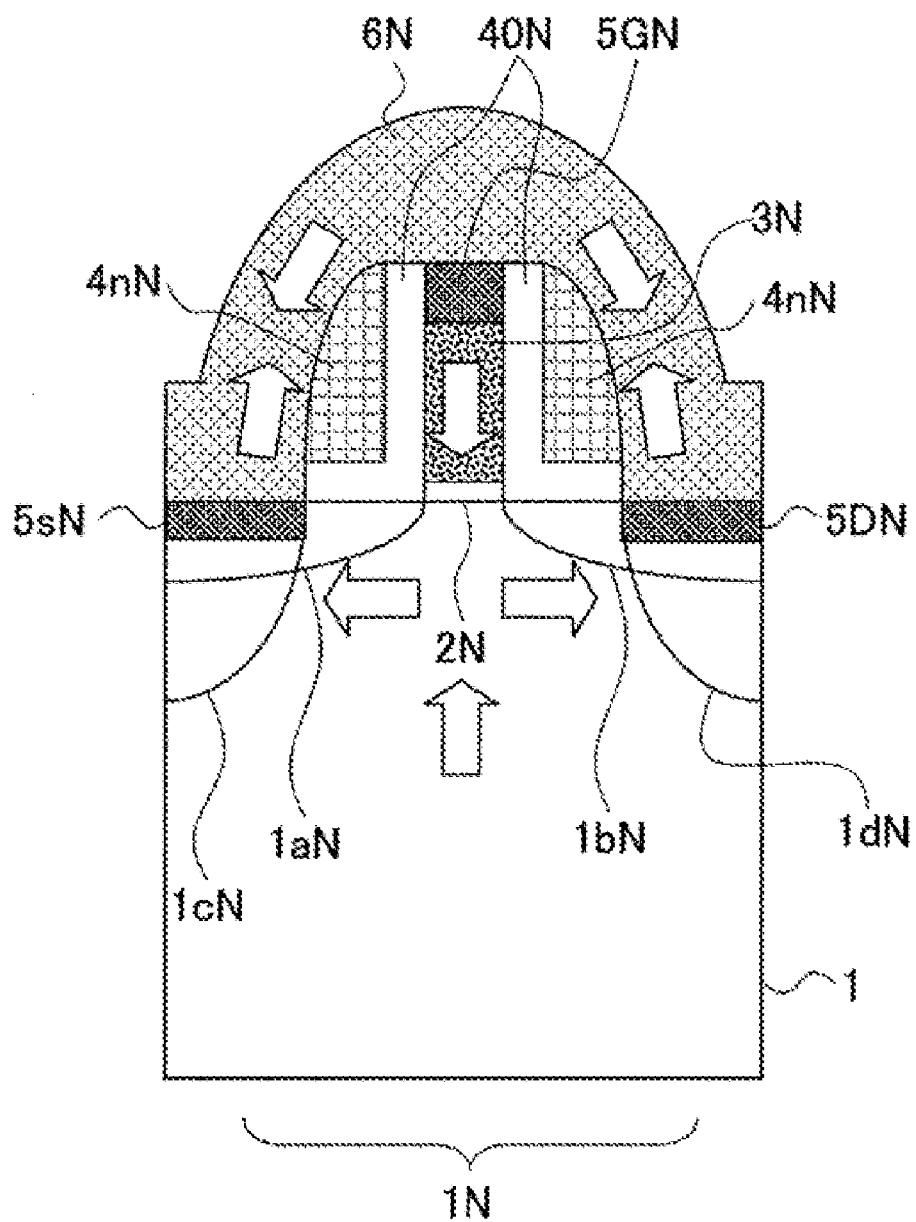
FIG. 2A shows the structure of a conventional strained n-channel MOS transistor.
Figure 2B:
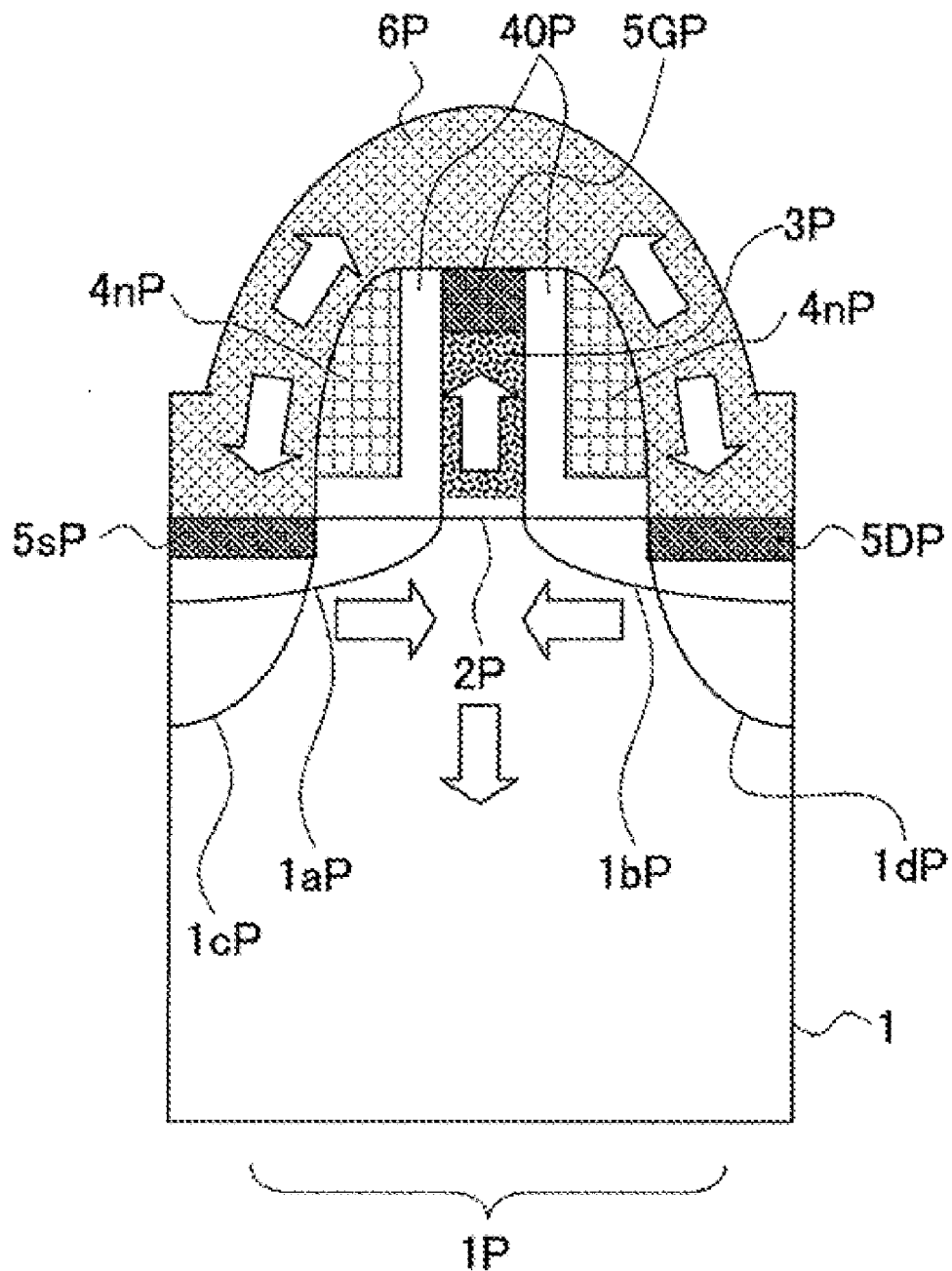
FIG. 2B shows the structure of a conventional strained p-channel MOS transistor.
Figure 3A:
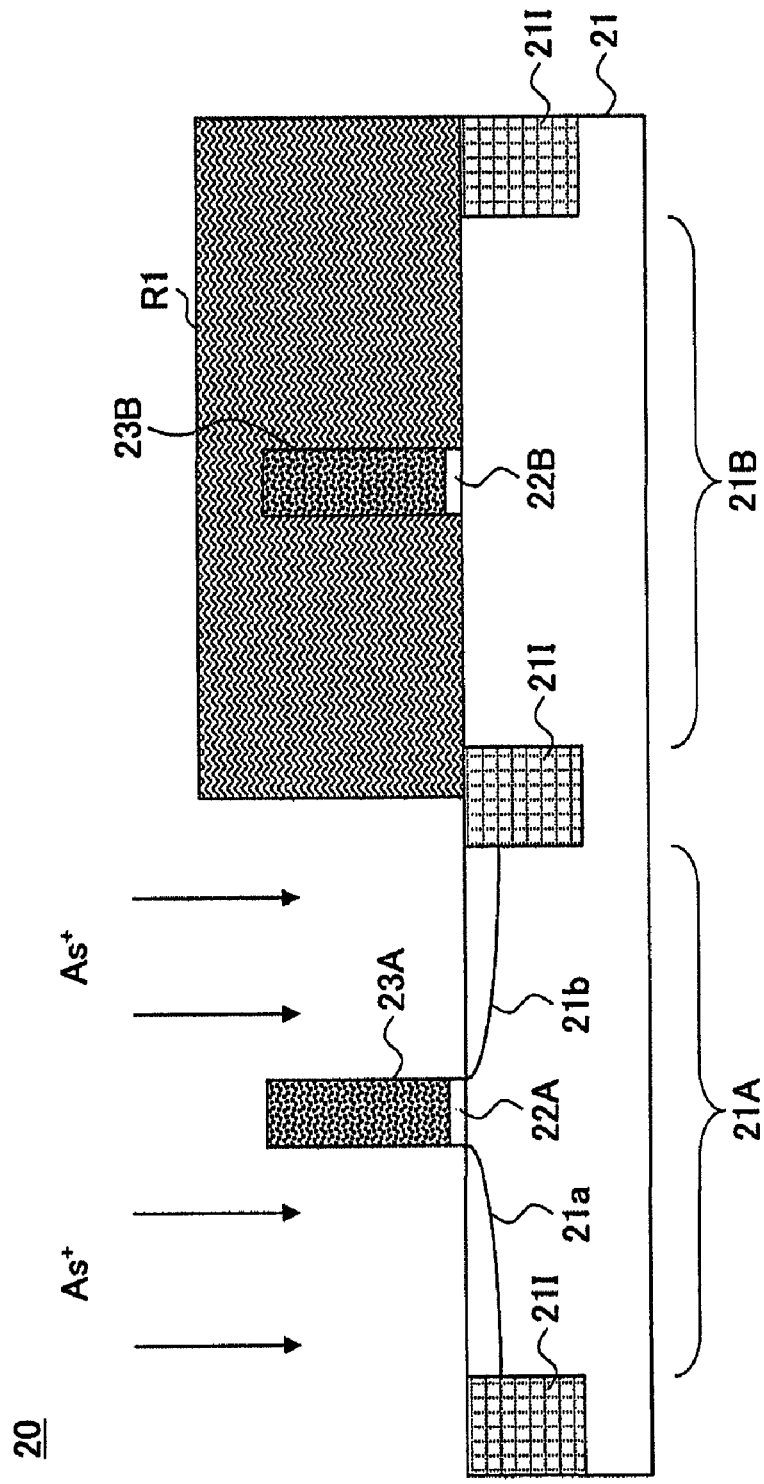
FIG. 3A shows a step of a manufacturing process for a CMOS device according to an embodiment of the present invention.

FIG. 3A shows a silicon substrate 21 in which device regions 21A and 21B for an n-channel MOS transistor and a p-channel MOS transistor, respectively, are defined by a device separating region 21I. In the device region 21A, a polysilicon gate electrode 23A is formed on the silicon substrate 21 via a gate insulating film 22A. In the device region 21B, a polysilicon gate electrode 23B is formed on the silicon substrate 21 via a gate insulating film 22B.

In the step shown in FIG. 3A, the device region 21B is covered with a resist pattern R1, while an n-type impurity element, such as As, P, or Sb, is introduced into the device region 21A by ion implantation, whereby n-type source and drain extension regions 21$a$ and 21$b$ are formed on either side of the gate electrode 23A. While not shown in the drawing, in the device region 21A, a p-type pocket implantation region is formed overlapping the source and drain extension regions 21$a$ and 21$b$ by tilted ion implantation of a p-type impurity element, such as In or B, at an angle of 0-45°. The pocket implantation may be performed by adding nitrogen, fluorine, or carbon as needed.

Also in the step of FIG. 3A, when forming the source extension region 21$a$ and the drain extension region 21$b$, a spacer layer with a thickness of 5 to 20 nm may be formed on the gate electrode 23A in order to optimize the overlap between the source and drain extension regions 21$a$ and 21$b$ and the gate electrode 23A.

Next, in the step of FIG. 3B, the device region 21A is covered with a resist pattern R2, while a p-type impurity element, such as B or $BF_2$, is introduced into the device region 21B by ion implantation in order to form p-type source and drain extension regions 21$c$ and 21$d$ on either side of the gate electrode 23B. While not shown in the drawing, in the device region 21B, an n-type pocket implantation region is formed overlapping the source and drain extension regions 21$c$ and 21$d$ by tilted ion implantation of an n-type impurity element, such as Sb, As, or P, at an angle of 0 to 45°. The pocket implantation may be performed by adding nitrogen, fluorine, or carbon as needed.

Also in the step of FIG. 3B, when forming the source and drain extension regions 21$c$ and 21$d$, a spacer layer with a thickness of 5 to 20 nm may be formed on the gate electrode 23B in order to optimize the overlap between the source and drain extension regions 21$c$ and 21$d$ and the gate electrode 23B.

Figure 3C:
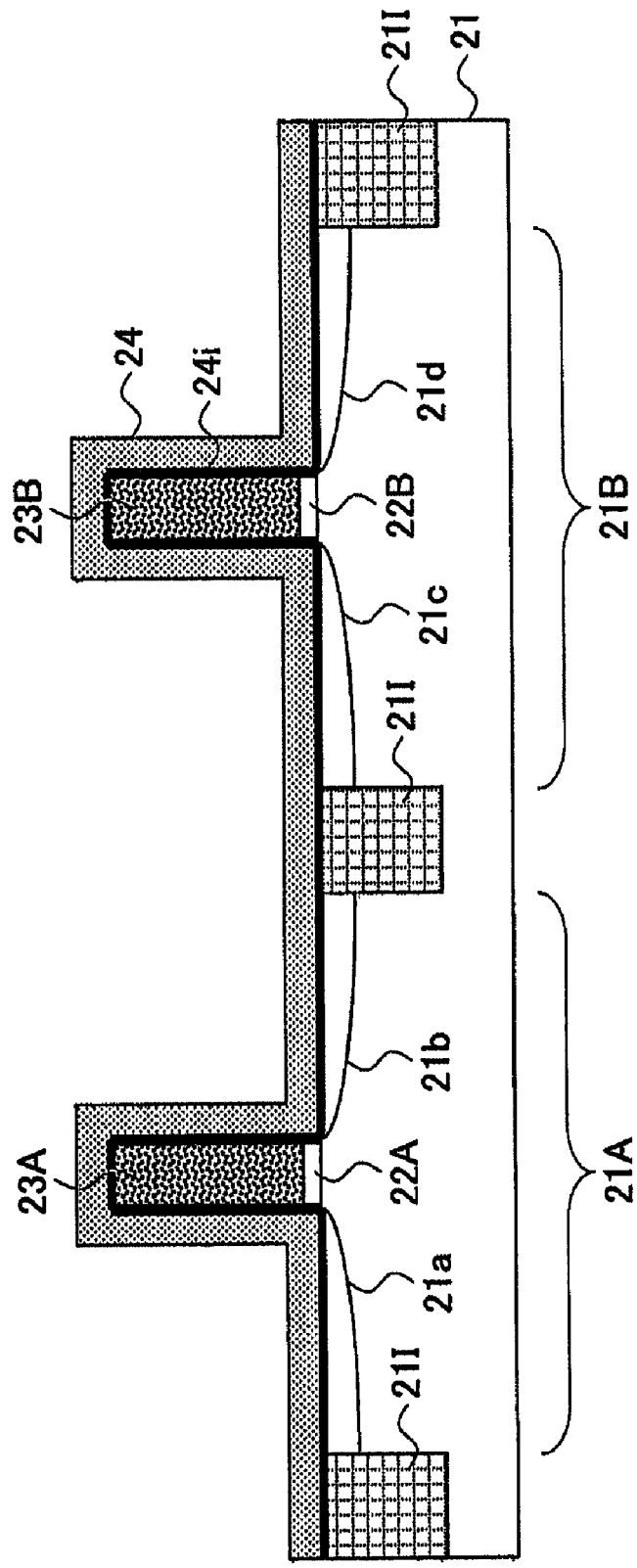
FIG. 3C shows another step of the CMOS device manufacturing process.

In the step shown in FIG. 3C, a silicon oxide film 24$i$ is formed on the silicon substrate 21 by chemical vapor deposition (CVD), for example, to a film thickness of 50 nm or smaller in such a manner as to continuously cover the gate electrodes 23A and 23B. Further thereon, a piezoelectric material film 24 of PZT or ZnO is formed to a film thickness of 20 nm, for example.

When a PZT film is formed by CVD as the piezoelectric material film 24, $Pb(C_{11}H_{19}O_2)_2$ may be used as Pb material, $Zr(C_9H_{15}O_2)_4$ may be used as Zr material, and $Ti(O\text{-}iC_3H_7)_2(C_{11}H_{19}O_2)_2$ may be used as Ti material, forming the film at substrate temperature of 550° C. or below.

In the step of FIG. 3C, the piezoelectric material film 24 is subjected to rapid thermal oxidation (RTO) in an oxygen atmosphere at temperature of 800 to 900° C. for several seconds, in order to crystallize the piezoelectric material film 24 and to simultaneously activate the impurity elements previously introduced in the steps of FIGS. 3A and 3B.

Figure 3E:
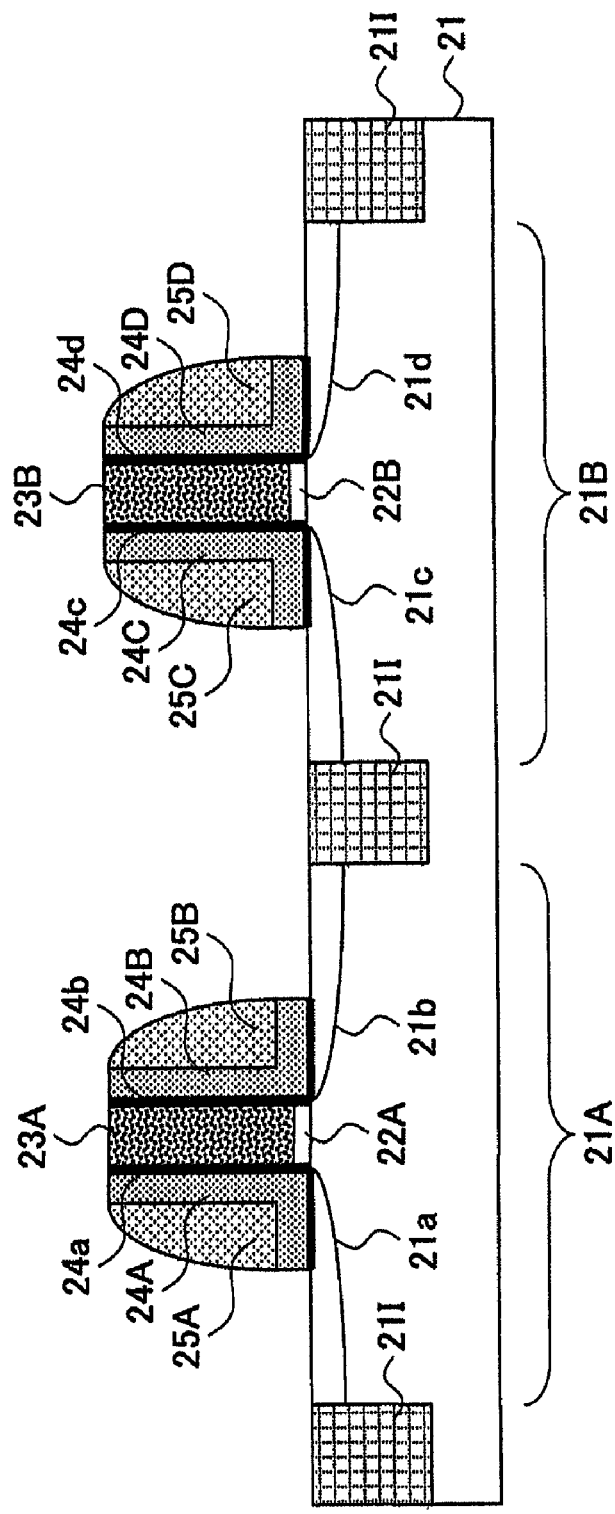
FIG. 3E shows another step of the CMOS device manufacturing process.

In the step of FIG. 3D, a silicon nitride film 25 is formed on the piezoelectric material film 24 by CVD to a film thickness of 150 nm or smaller. In the step of FIG. 3E, the silicon nitride film 25 and the piezoelectric material film 24 below it are etched back using a high-density plasma etching apparatus. As a result, as shown in FIG. 3E, in the device region 21A, a sidewall silicon nitride film pattern 25A is formed on a first sidewall surface of the gate electrode 23A via a silicon sidewall oxide film pattern 24$a$ and a sidewall piezoelectric film pattern 24A. On a second sidewall surface of the gate electrode 23A, there is formed a sidewall silicon nitride film pattern 25B via a silicon sidewall oxide film pattern 24$b$ and a sidewall piezoelectric film pattern 24B. In the device region 21B, a sidewall silicon nitride film pattern 25C is formed on a first sidewall surface of the gate electrode 23B via a silicon sidewall oxide film pattern 24$c$ and a sidewall piezoelectric film pattern 24C. On a second sidewall surface of the gate electrode 23B, there is formed a sidewall silicon nitride film pattern 25D via a silicon sidewall oxide film pattern 24$d$ and a sidewall piezoelectric film pattern 24D.

Figure 3F:
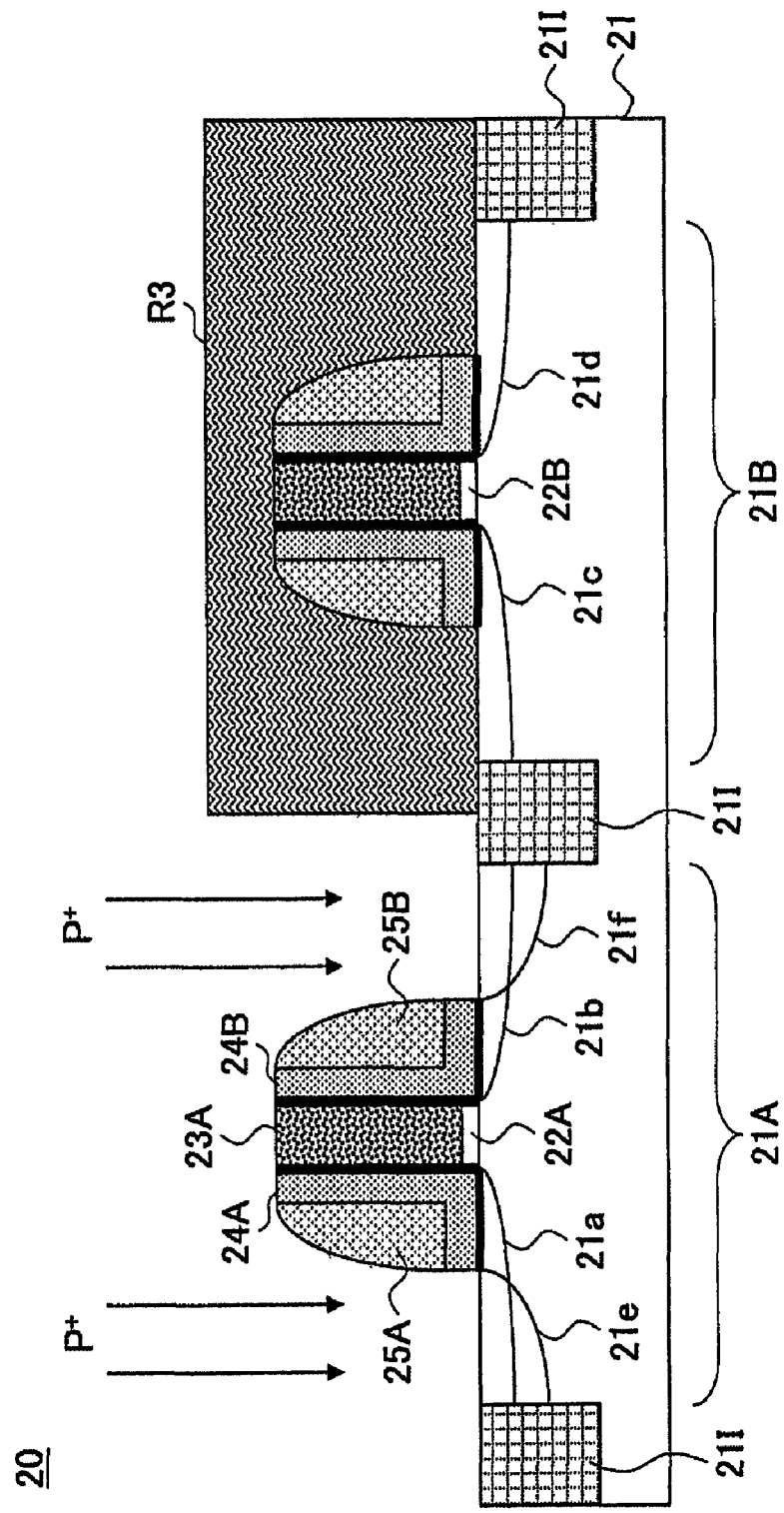
FIG. 3F shows another step of the CMOS device manufacturing process.

In the step of FIG. 3F, the device region 21B is covered with a resist pattern R3, and the device region 21A is ion-implanted with an n-type impurity element, such as P or As. In the device region 21A, there are formed an $n^+$ source diffusion region 21$e$ and an $n^+$ drain diffusion region 21$f$ outside the sidewall insulating films 25A and 25B, respectively, in the silicon substrate 21.

In the step of FIG. 3G, the resist pattern R3 is removed. The device region 21A is covered with a resist pattern R4, and the device region 21B is ion-implanted with a p-type impurity element, such as B or $BF_2$. In the device region 21B, a $p^+$ source diffusion region 21$g$ and a $p^+$ drain diffusion region 21$h$ are formed outside the sidewall insulating films 25C and 25D, respectively, in the silicon substrate 21.

In the step of FIG. 3H, the resist R4 is removed. After the source region 21$e$, the drain region 21$f$, the source region 21$g$, and the drain region 21$h$ are activated, an interlayer insulating film 26 is formed on the silicon substrate 21. Further, in the interlayer insulating film 26, contact plugs 27A through 27F are formed in contact with the source region 21$e$, the gate electrode 23A, the drain region 21$f$, the source region 21$g$, the gate electrode 23B, and the drain region 21$h$, respectively. While not shown in the drawing, on the surface of each of the source region 21$e$, the gate electrode 23A, the drain region 21$f$, the source region 21$g$, the gate electrode 23B, and the drain region 21$h$, a low-resistance silicide pattern is formed.

In the present embodiment, the source and drain regions are formed after the formation of the sidewall structures having a piezoelectric material film. The order of formation of such regions and structures is not particularly limited. For example, after dummy sidewall structures for forming the source and drain regions are formed using a silicon oxide film or a silicon nitride film as an implantation mask, the dummy sidewall structures may be removed by wet etching, and a piezoelectric material film may be deposited. Thereafter, an activation process may be performed by RTO, and then a silicon nitride film may be deposited, followed by an etch back to form a sidewall structure having a piezoelectric material film.

The contact plug 27A is also in contact with the sidewall piezoelectric film pattern 24A. The contact plug 27B is in contact with both the sidewall piezoelectric film patterns 24A and 24B over the gate electrode 23A. The contact plug 27C is also in contact with the sidewall piezoelectric film pattern 24B.

Similarly, the contact plug 27D is also in contact with the sidewall piezoelectric film pattern 24C. The contact plug 27E is in contact with both the sidewall piezoelectric film patterns 24C and 24D, over the gate electrode 23B. The contact plug 27F is also in contact with the sidewall piezoelectric film pattern 24D.

In the following, an operation of the thus formed p-channel MOS transistor and n-channel MOS transistor is described with reference to FIGS. 4A through 7B.

Figure 4A:
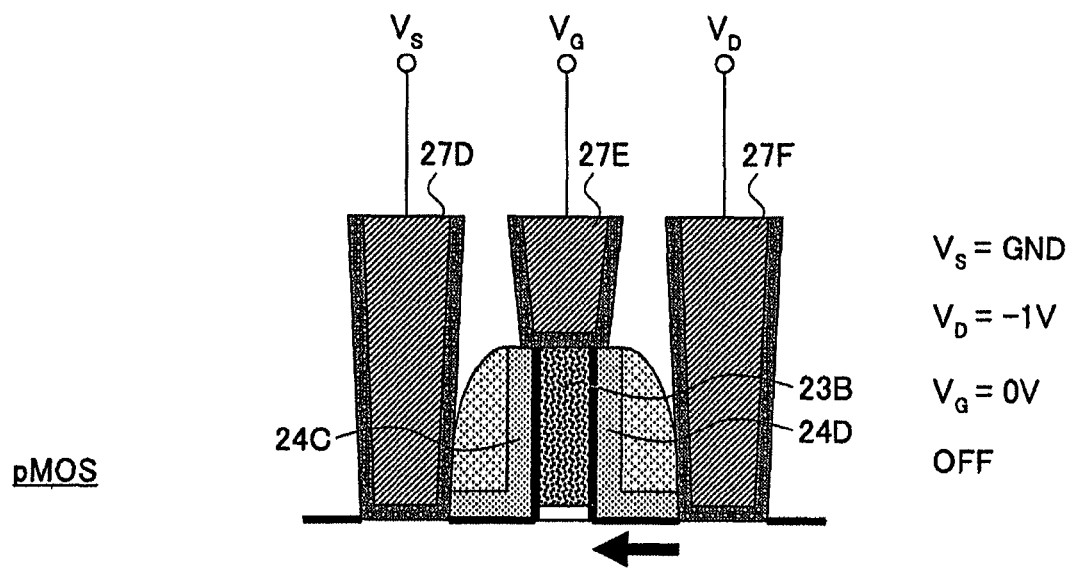
FIG. 4A shows an example illustrating the operating principle of a p-channel MOS transistor according to an embodiment.
Figure 4B:
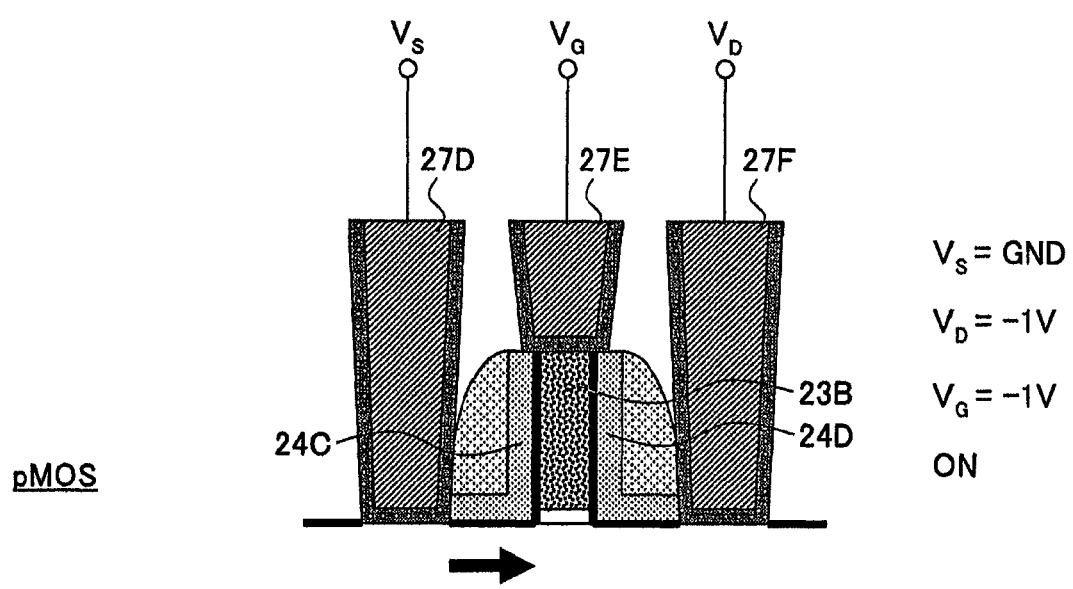
FIG. 4B shows another example illustrating the operating principle of the p-channel MOS transistor.

FIGS. 4A and 4B illustrate on/off operation modes of the p-channel MOS transistor formed in the device region 21B of FIG. 3H. Parts that have previously been described are referenced with the same reference numerals.

In FIGS. 4A and 4B, the direction from the source electrode 27D to the gate electrode 23B and from the gate electrode 23B to the drain electrode 27F is defined as the forward direction. The piezoelectric material film 24 is polarized such that when a negative voltage is applied in the forward direction, the piezoelectric material film extends; when a positive voltage is applied, the piezoelectric material film contracts.

With reference to FIG. 4A, the source electrode 27D is grounded ($V_S$=GND). While a power supply voltage of −1 V is applied to the drain electrode 27F ($V_D$=−1 V), 0 V is applied to the gate electrode 23B (27E) ($V_G$=0 V), so that the transistor is off.

In this case, because the voltage of −1 V is applied between the drain electrode 27F and the gate electrode 23B, the piezoelectric film pattern 24D expands as indicated by the arrow in FIG. 4A. As a result, stress is applied to the silicon substrate 21 below that extends the crystal lattice of the substrate in the gate length direction. Such stress induces a compressive stress in the channel region immediately below the gate electrode 23B that acts in the gate length direction from the drain end. On the other hand, no stress is applied between the source region and the channel region in the state of FIG. 4A. Thus, there is little modulation in the band structure of the silicon at the drain end of the transistor, so that the off-current of the transistor does not increase.

In the case of FIG. 4B, a gate voltage of −1 V is applied to the gate electrode 23B ($V_G$=−1 V), so that the transistor is in the on-state. However, there is no potential difference between the gate electrode 23B and the drain electrode 27F. Thus, no electric field is applied to the sidewall piezoelectric film pattern 24D. On the other hand, a potential difference is caused between the gate electrode 23B and the source electrode 27D, so that a drive electric field is applied to the sidewall piezoelectric film pattern 24C. As a result, the piezoelectric film pattern 24C expands as indicated by the arrow in FIG. 4B, whereby a compressive stress is applied in the channel region immediately below the gate electrode 23B in the gate length direction from the source end. Thus, the on-current of the p-channel MOS transistor increases and so does its operating speed.

Figure 5A:
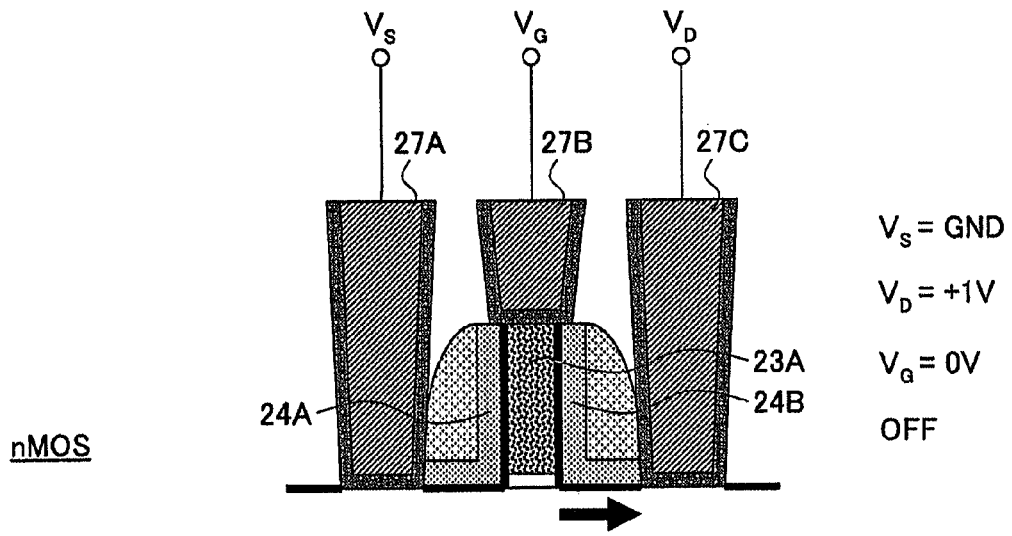
FIG. 5A shows an example illustrating the operating principle of an n-channel MOS transistor according to an embodiment.
Figure 5B:
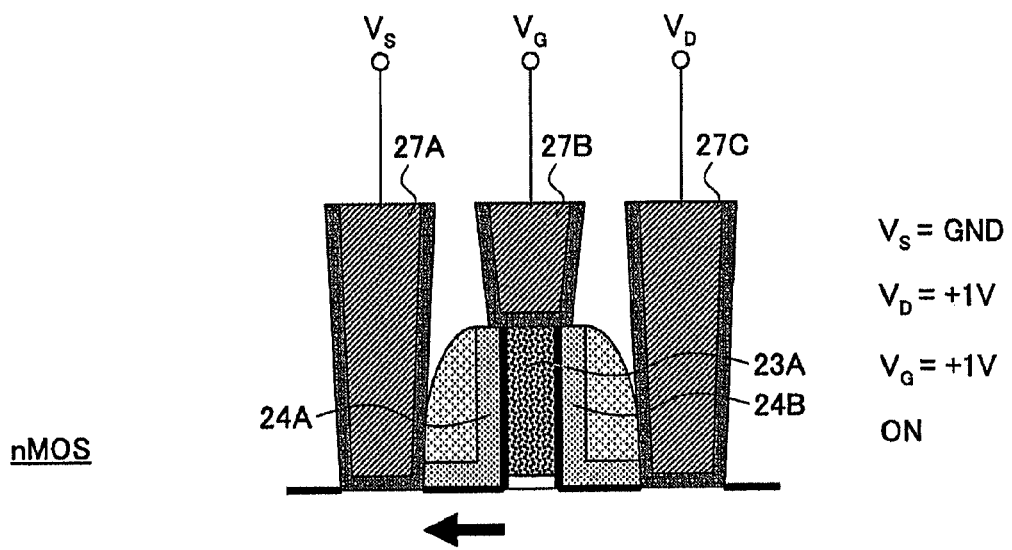
FIG. 5B shows another example illustrating the operating principle of the p-channel MOS transistor.

FIGS. 5A and 5B illustrate on/off operation modes of the n-channel MOS transistor formed in the device region 21A shown in FIG. 3H. Parts that have been previously described are referenced with the same numerals.

In FIGS. 5A and 5B, the direction from the source electrode 27A to the gate electrode 23A and from the gate electrode 23A to the drain electrode 27C is defined as the forward direction. The piezoelectric material film 24 is polarized such that, when a negative voltage is applied in the forward direction, the piezoelectric material film extends; when a positive voltage is applied, the piezoelectric material film contracts.

With reference to FIG. 5A, the source electrode 27A is grounded ($V_S$=GND), and a power supply voltage of +1 V is applied to the drain electrode 27C ($V_D$=+1 V). However, 0 V ($V_G$=0 V) is applied to the gate electrode 23A (27B), so that the transistor is off.

In this case, because +1 V is applied between the drain electrode 27C and the gate electrode 23A, the piezoelectric film pattern 24B contracts as indicated by the arrow in FIG. 5A, whereby stress is applied to the silicon substrate 21 below that contracts the crystal lattice of the substrate in the gate length direction. Such stress induces a tensile stress in the channel region immediately below the gate electrode 23A that acts in the gate length direction from the drain end. On the other hand, no stress is applied between the source region and the channel region. Thus, there is little modulation in the band structure of the Si crystal on the source end of the channel region, so that the off-current does not increase.

In the state shown in FIG. 5B, a gate voltage of +1 V is applied to the gate electrode 23A ($V_G$=+1 V), so that the transistor is in the on-state. However, there is no potential difference between the gate electrode 23A and the drain electrode 27C, so that no stress is applied on the drain end of the channel region. On the other hand, because a potential difference is caused between the gate electrode 23A and the source electrode 27A, a drive electric field is applied to the sidewall piezoelectric film pattern 24A. As a result, the piezoelectric film pattern 24A contracts as indicated by the arrow in FIG. 5B, whereby a tensile stress is applied in the channel region immediately below the gate electrode 23A that acts in the gate length direction from the source end. Thus, the on-current of the n-channel MOS transistor increases and so does its operating speed.

Figure 6A:
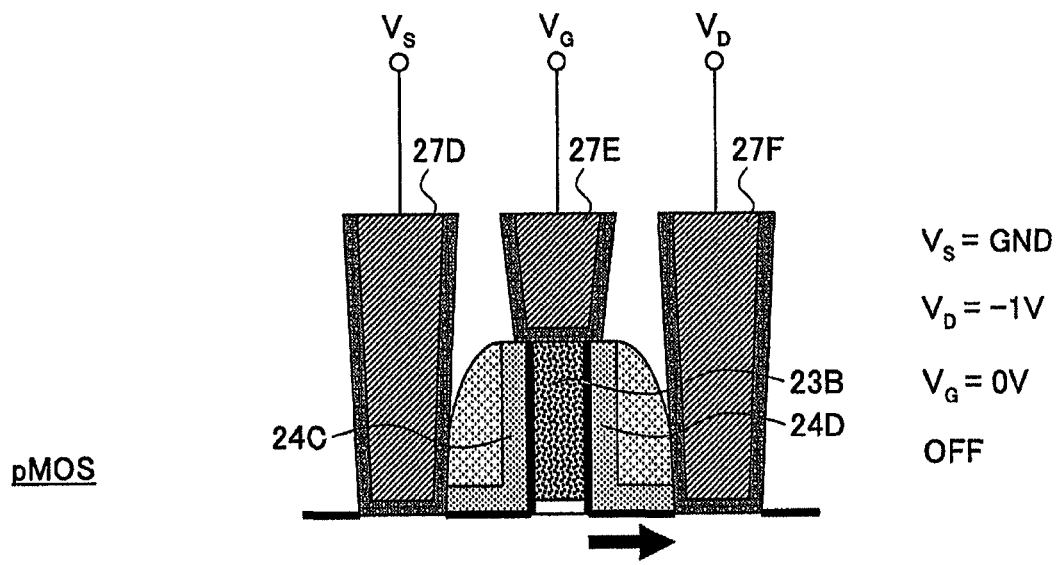
FIG. 6A shows an example illustrating the operating principle of a p-channel MOS transistor according to another embodiment.
Figure 6B:
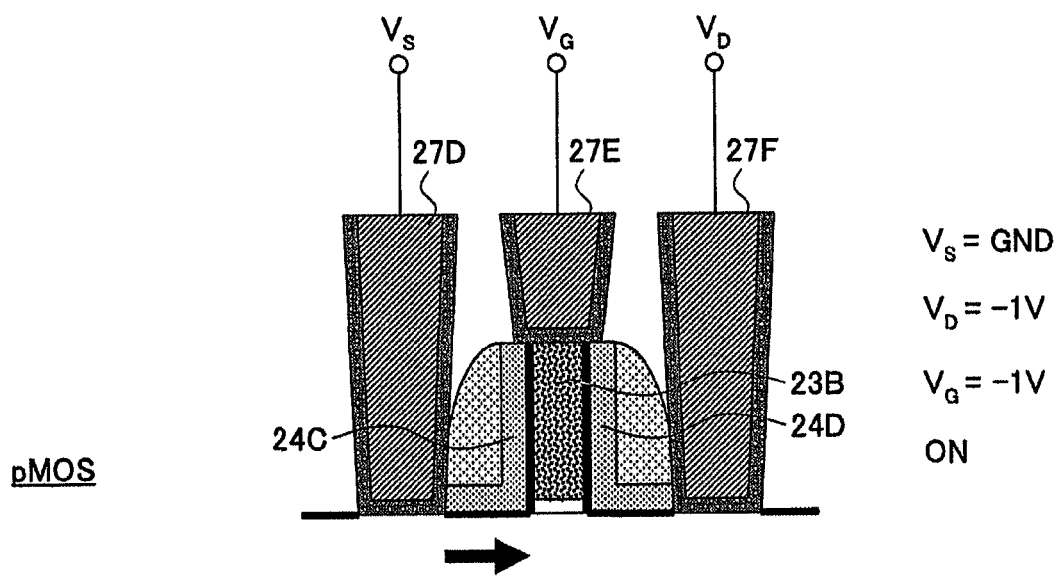
FIG. 6B shows another example illustrating the operating principle of the p-channel MOS transistor.

FIGS. 6A and 6B illustrate another on/off operation modes of the p-channel MOS transistor. Parts that have previously been described are referenced with the same reference numerals.

In FIGS. 6A and 6B, the direction from the source electrode 27D to the gate electrode 23B and the direction from the drain electrode 27F to the gate electrode 23B are defined as the forward direction. The piezoelectric material film 24 is polarized such that when a negative voltage is applied in the forward direction, the piezoelectric material film expands; when a positive voltage is applied, it contracts.

With reference to FIG. 6A, the source electrode 27D is grounded ($V_S$=GND), and a power supply voltage of −1 V is applied to the drain electrode 27F ($V_D$=−1 V). However, 0 V ($V_G$=0 V) is applied to the gate electrode 23B (27E), so that the transistor is off.

In this case, because the voltage of −1 V is applied between the drain electrode 27F and the gate electrode 23B, the piezoelectric film pattern 24D expands as indicated by the arrow in FIG. 6A, whereby stress is applied to the silicon substrate 21 immediately below that compresses the crystal lattice of the substrate in the gate length direction. Such stress induces a tensile stress in the channel region immediately below the gate electrode 23B that acts in the gate length direction. As a result, the band structure of the Si crystal at the drain end is modulated such that the source-drain current decreases, thereby decreasing the off-leakage current of the transistor.

In the state shown in FIG. 6B, a gate voltage of −1 V is applied to the gate electrode 23B ($V_G$=−1 V) so that the transistor is in the on-state. However, because there is no potential difference between the gate electrode 23B and the drain electrode 27F, the sidewall piezoelectric film pattern 24D does not apply any stress at the drain end. On the other hand, because a potential difference is caused between the gate electrode 23B and the source electrode 27D, a drive electric field is applied to the sidewall piezoelectric film pattern 24C. As a result, the piezoelectric film pattern 24C expands as indicated by the arrow in the drawing, whereby a compressive stress is applied in the channel region immediately below the gate electrode 23B that acts in the gate length direction from the source end. Thus, the on-current of the p-channel MOS transistor increases and so does its operating speed.

Figure 7A:
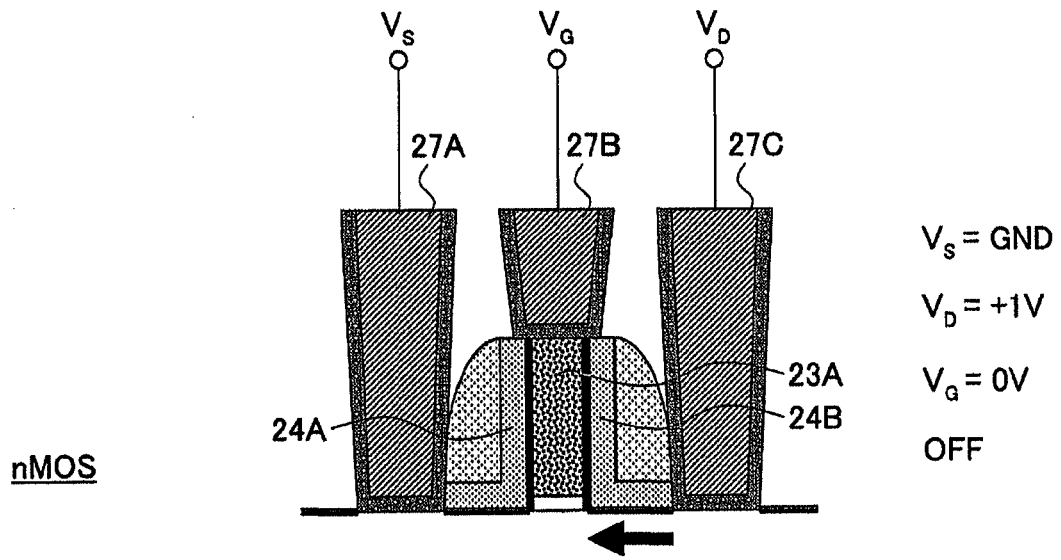
FIG. 7A shows an example illustrating the operating principle of an n-channel MOS transistor according to an embodiment.
Figure 7B:
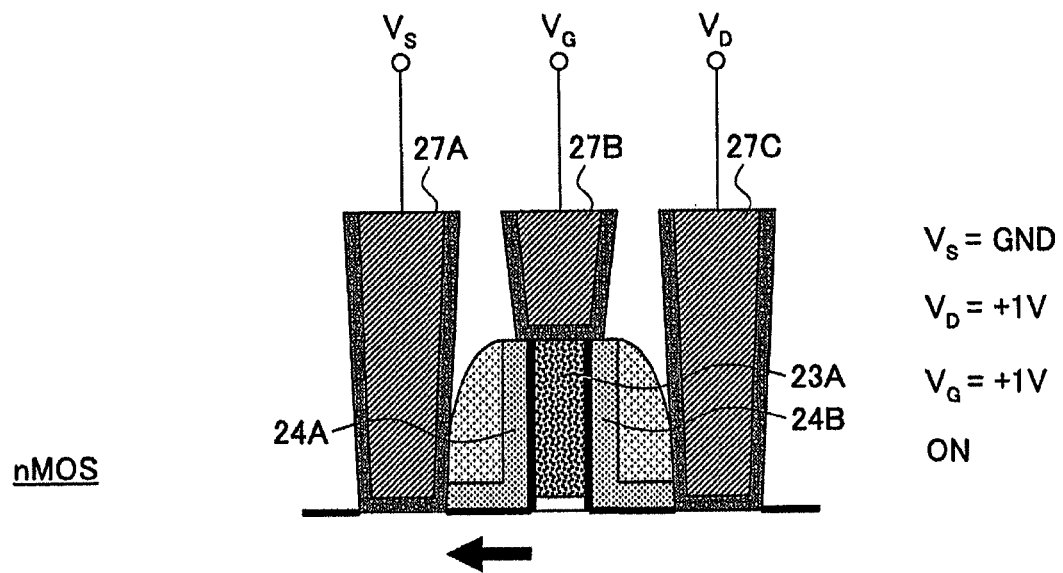
FIG. 7B shows another example illustrating the operating principle of the p-channel MOS transistor.

FIGS. 7A and 7B illustrate another on/off operation modes of the n-channel MOS transistor. Parts shown in the drawings that have previously been described are referenced with the same reference numerals.

In FIGS. 7A and 7B, the direction from the source electrode 27A to the gate electrode 23A and the direction from the drain electrode 27C to the gate electrode 23A are defined as the forward direction. The piezoelectric material film 24 is polarized such that when a negative voltage is applied in the forward direction, the piezoelectric material film extends; when a positive voltage is applied, it contracts.

With reference to FIG. 7A, the source electrode 27A is grounded ($V_S$=GND), and a power supply voltage of +1 V is applied to the drain electrode 27C ($V_D$=+1 V). However, 0 V ($V_G$=0 V) is applied to the gate electrode 23A (27B), so that the transistor is off.

In this case, because of the +1 V applied between the drain electrode 27C and the gate electrode 23A, the piezoelectric film pattern 24B expands as indicated by the arrow in the drawing, whereby stress is applied to the silicon substrate 21 below that expands the crystal lattice of the substrate in the gate length direction. Such stress induces a compressive stress in the channel region immediately below the gate electrode 23A that acts in the gate length direction from the drain end. Thus, the band structure of the Si crystal on the drain end of the channel region is modulated, whereby the off-leakage current decreases. On the other hand, no stress is applied between the source region and the channel region.

In the state shown in FIG. 7B, a gate voltage of +1 V is applied to the gate electrode 23A ($V_G$=+1 V), so that the transistor is in the on-state. However, because there is no potential difference between the gate electrode 23A and the drain electrode 27C, no stress is applied on the drain end of the channel region. On the other hand, because a potential difference is caused between the gate electrode 23A and the source electrode 27A, a drive electric field is applied to the sidewall piezoelectric film pattern 24A. As a result, the piezoelectric film pattern 24A contracts as indicated by the arrow in the drawing, whereby a tensile stress is applied to the channel region immediately below the gate electrode 23A that acts in the gate length direction from the source end. Thus, the on-current of the n-channel MOS transistor increases and so does its operating speed.

Figure 8:
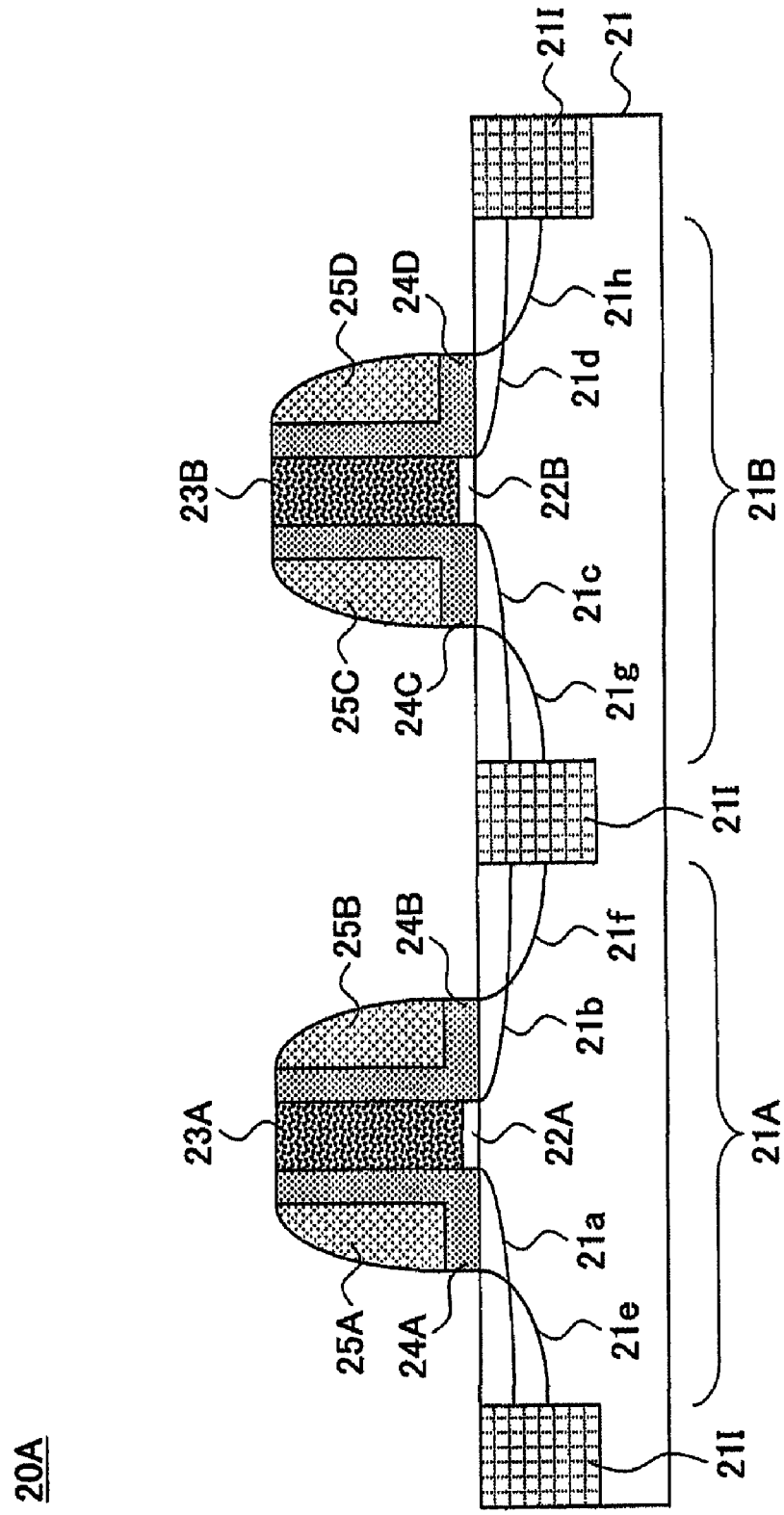
FIG. 8 shows the structure of a CMOS device according to another embodiment.

FIG. 8 shows the structure of a CMOS device according to a variation of the foregoing embodiment. Parts shown in the drawing that have been previously described are referenced with the same numerals.

With reference to FIG. 8, in the present embodiment, the piezoelectric material films 24A and 24B are formed directly on the polysilicon gate electrode 23A without the CVD oxide films 24a, 24b, 24c, and 24d.

Second Embodiment

In the following, a manufacturing process for a CMOS device 40 according to a second embodiment of the invention is described with reference to FIGS. 9A through 9G. Parts shown in these drawings that have previously been described are referenced with the same numerals.

Figure 9A:
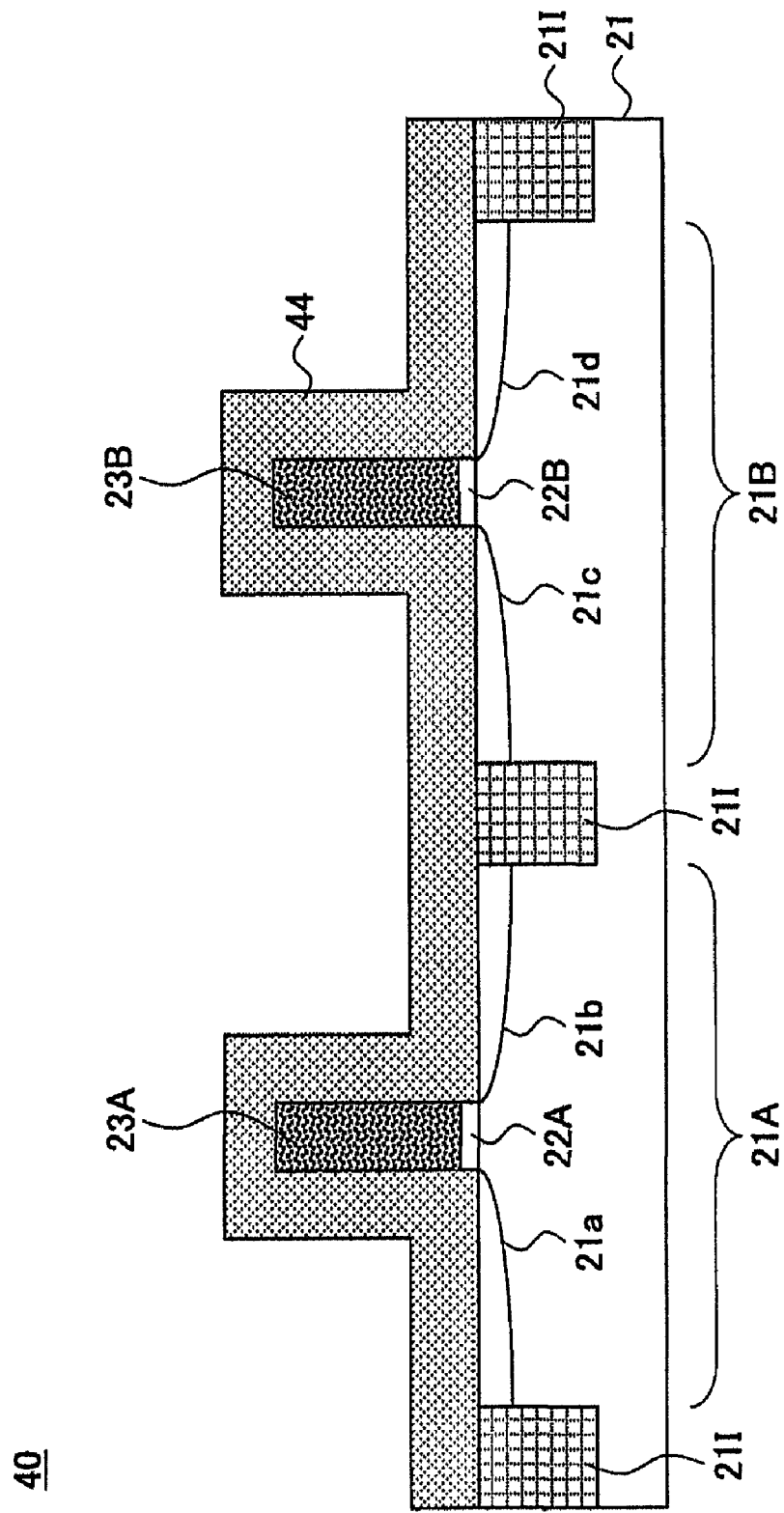
FIG. 9A shows a step of a manufacturing process for a CMOS device according to another embodiment.
Figure 9B:
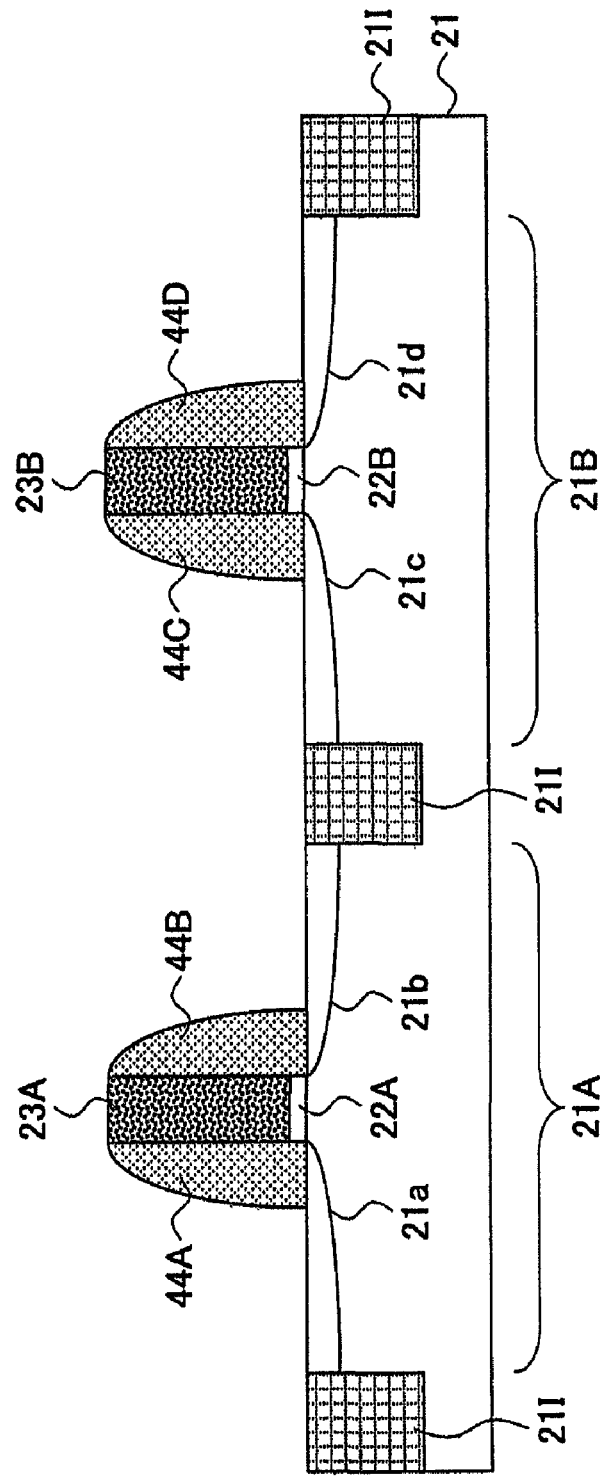
FIG. 9B shows another step of the CMOS device manufacturing process.

In the step of FIG. 9A, which is performed following the previously described step of FIG. 3B, an insulating film 44, which may be a silicon oxide film or a silicon nitride film, is formed over the structure of FIG. 3B by CVD. The insulating film 44 is then etched back in the step of FIG. 9B. As a result, sidewall insulating films 44A and 44B are formed on either sidewall surface of the gate electrode 23A, and sidewall insulating films 44C and 44D are formed on either sidewall surface of the gate electrode 23B.

In the step of FIG. 9C, an n-type impurity element is introduced into the device region 21A and a p-type impurity element into the device region 21B by ion implantation using an individual mask process. In the silicon substrate 21, n⁺ source and drain regions 21e and 21f are formed in the device region 21A outside the sidewall insulating films 44A and 44B, respectively. In the device region 21B, p⁺ source and drain regions 21g and 21h are formed outside the sidewall insulating films 44C and 44D, respectively. While not shown in the drawing, a low-resistance silicide pattern is formed in the source and drain regions after activation annealing.

Figure 9E:
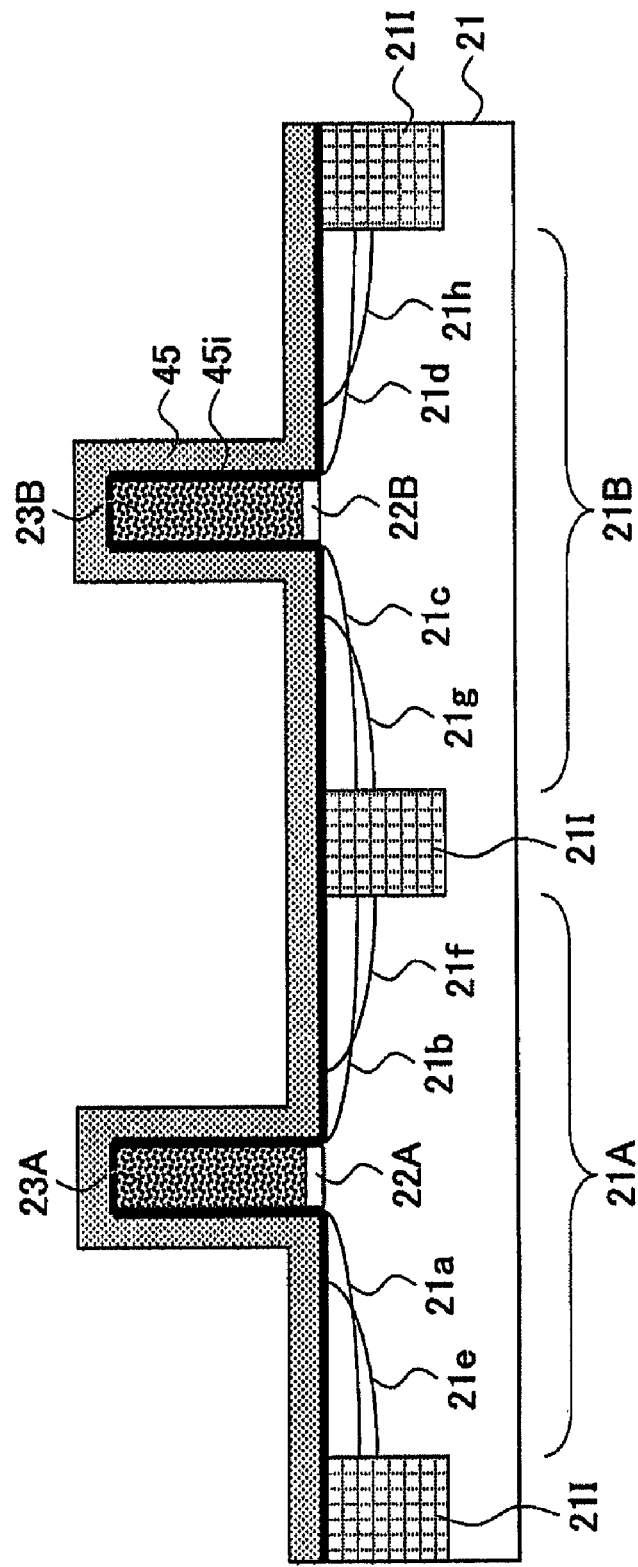
FIG. 9E shows another step of the CMOS device manufacturing process.

In the present embodiment, in the next step of FIG. 9D, the sidewall insulating films 44A through 44D are removed by wet etching. In the step of FIG. 9E, a piezoelectric material film 45 similar to the aforementioned piezoelectric material film 24 is formed by CVD via a CVD oxide film 45i similar to the aforementioned CVD oxide film 24i, in such a manner as to cover the surface of the silicon substrate 21 and the exposed polysilicon gate electrodes 23A and 23B. While the sidewall insulating films 44A through 44D are removed by wet etching in the present embodiment, they may be removed by other techniques, such as isotropic selective dry etching.

Figure 9F:
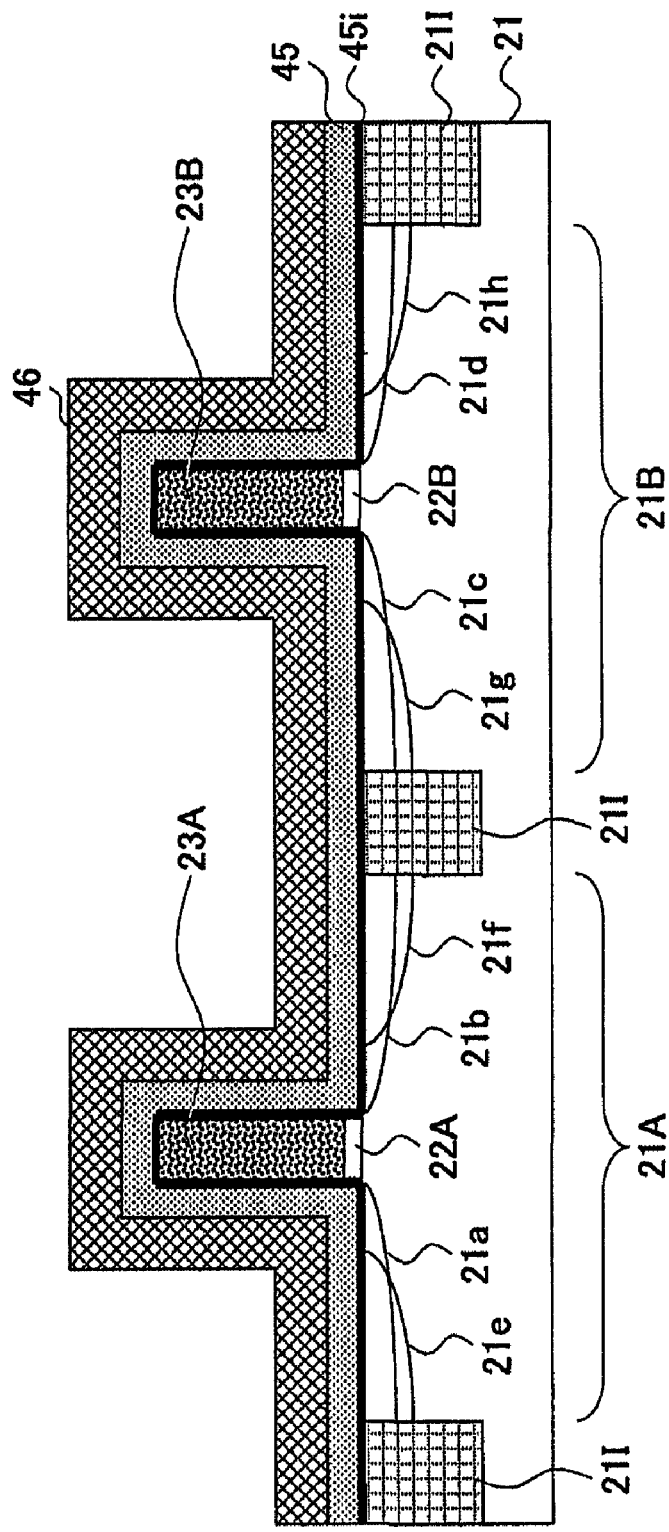
FIG. 9F shows another step of the CMOS device manufacturing process.

In the step of FIG. 9F, a film 46 that can block hydrogen, such as a silicon nitride film or an Al₂O₃ film, is formed on the structure of FIG. 9E by CVD in such a manner as to continuously cover the piezoelectric material film 45.

In the step of FIG. 9G, an interlayer insulating film 26 is formed over the structure of FIG. 9F in the same way as in the previously described step of FIG. 3H. Further, contact plugs 27A through 27F are formed within the interlayer insulating film 26 in the same way as described above, whereby the CMOS device 40 is obtained.

In the CMOS device 40 shown in FIG. 9G, the piezoelectric material film 45 is protected by the hydrogen blocking film 46, so that deterioration in the characteristics of the piezoelectric material film 45 can be effectively prevented.

In accordance with the foregoing embodiments of the present invention, the piezoelectric material film exists continuously between the p-channel and n-channel MOS transistors, as shown in FIG. 9G. However, the piezoelectric material film may be separated between the p-channel and the n-channel MOS transistors by dry etching as needed.

The piezoelectric material film may be other than the PZT film, such as a film of PLZT, ZnO, or $SrBi_2Ta_2O_9$ (SBT).

In accordance with the foregoing embodiments of the present invention, because a piezoelectric material film is formed covering the device region surface and the surface of the gate electrode pattern, a desired stress can be applied to the channel region depending on the drive state of the semiconductor device, so that the operating speed of the semiconductor device can be increased. Particularly, an asymmetric stress distribution can be induced between the source end and the drain end of the channel region, whereby the mobility can be increased in the on-state alone of a p-channel or n-channel MOS transistor, while the increase in mobility in the off-state can be prevented or reduced. Furthermore, there is no need to change the stress-applying structure between the p-channel MOS transistor and the n-channel MOS transistor, so that the semiconductor device manufacturing process can be simplified.

Although this invention has been described in detail with reference to certain embodiments, variations and modifications exist within the scope and spirit of the invention as described and defined in the following claims.

What is claimed is:

1. A semiconductor device comprising:
    a semiconductor substrate;
    a gate electrode formed on the semiconductor substrate;
    source and drain extension regions formed in the semiconductor substrate on a first and a second side corresponding to a first sidewall surface and a second sidewall surface of the gate electrode;
    a first piezoelectric material pattern formed on the semiconductor substrate that continuously covers the first sidewall surface of the gate electrode from the first side of the gate electrode;
    a second piezoelectric material pattern formed on the semiconductor substrate that continuously covers the second sidewall surface of the gate electrode from the second side of the gate electrode;
    source and drain regions formed in the semiconductor substrate outside the source extension region and the drain extension region, respectively; and
    a contact for applying a voltage to the first and the second piezoelectric material patterns,
    wherein a source contact is formed in the source region, a drain contact is formed in the drain region, and a gate contact is formed on the gate electrode, and
    the source contact is in contact with the first piezoelectric material pattern, the drain contact is in contact with the second piezoelectric material pattern, and the gate electrode is in contact with the first and the second piezoelectric material patterns.

2. The semiconductor device according to claim 1, wherein the first piezoelectric material pattern is in direct contact with the semiconductor substrate surface and the first sidewall surface of the gate electrode, and the second piezoelectric material pattern is in direct contact with the semiconductor substrate surface and the second sidewall surface of the gate electrode.

3. The semiconductor device according to claim 1, wherein the first piezoelectric material pattern is in contact with the semiconductor substrate surface and the first sidewall surface of the gate electrode via a first silicon oxide film, and the second piezoelectric material pattern is in contact with the semiconductor substrate surface and the second sidewall surface of the gate electrode via a second silicon oxide film.

4. The semiconductor device according to claim 1, further comprising:
    a first sidewall insulating film formed on the first piezoelectric material pattern; and
    a second sidewall insulating film formed on the second piezoelectric material pattern,
    wherein the source region is formed in the semiconductor substrate outside the first sidewall insulating film, and the drain region is formed in the semiconductor substrate outside the second sidewall insulating film.

5. The semiconductor device according to claim 1, wherein the first and the second piezoelectric material patterns are made of PZT, PLZT, ZnO, or $SrBi_2Ta_2O_9$ (SBT).

6. The semiconductor device according to claim 1, wherein the first and the second sidewall insulating films are silicon oxide films or silicon nitride films.

7. A process of manufacturing a semiconductor device comprising:
    forming a gate electrode pattern on a semiconductor substrate;
    forming source and drain extension regions in the semiconductor substrate on a first and a second side, respectively, of the gate electrode pattern by introducing a first impurity element into the semiconductor substrate using the gate electrode pattern as a mask;
    forming a piezoelectric material film on the semiconductor substrate in such a manner as to cover a first sidewall surface and a second sidewall surface of the gate electrode and in a shape matching a shape of the gate electrode pattern;
    depositing an insulating film on the semiconductor substrate such that the piezoelectric material film is covered by the insulating film;
    forming a first sidewall insulating film on a first piezoelectric material pattern of the piezoelectric material film on the first sidewall surface of the gate electrode and forming a second sidewall insulating film on a second piezoelectric material pattern on the piezoelectric material film on the second sidewall surface of the gate electrode by etching back the insulating film and the piezoelectric material film;
    forming a source region and a drain region in the semiconductor substrate outside the first sidewall insulating film and the second sidewall insulating film, respectively, by introducing a second impurity element into the semiconductor substrate using the gate electrode pattern and the first and the second sidewall insulating films as masks; and
    forming a contact for applying a voltage to the piezoelectric material film,
    wherein a source contact is formed in the source region, a drain contact is formed in the drain region, and a gate contact is formed on the gate electrode, and
    the source contact is in contact with the first piezoelectric material pattern, the drain contact is in contact with the second piezoelectric material pattern, and the gate electrode is in contact with the first and the second piezoelectric material patterns.

8. A process of manufacturing a semiconductor device comprising:
    forming a gate electrode pattern on a semiconductor substrate;
    forming a source and a drain extension region in the semiconductor substrate on a first and a second side, respectively, of the gate electrode pattern by introducing a first impurity element into the semiconductor substrate using the gate electrode pattern as a mask;
    depositing an insulating film on the semiconductor substrate that covers the gate electrode pattern;

depositing a first and a second sidewall insulating film on the first and the second side, respectively, of the gate electrode pattern by etching back the insulating film;

forming a source and a drain region in the semiconductor substrate outside the first and the second sidewall insulating film, respectively, by introducing a second impurity element using the gate electrode pattern and the first and the second sidewall insulating films as masks;

removing the first and the second sidewall insulating films;

depositing a piezoelectric material film on the semiconductor substrate that covers the gate electrode pattern; and forming a contact for applying a voltage to the piezoelectric material film.

* * * * *